(12) United States Patent
Koshimizu et al.

(10) Patent No.: US 10,790,388 B2
(45) Date of Patent: Sep. 29, 2020

(54) SEMICONDUCTOR DEVICE AND METHOD FOR MANUFACTURING THE SAME

(71) Applicant: Renesas Electronics Corporation, Tokyo (JP)

(72) Inventors: Makoto Koshimizu, Hitachinaka (JP); Komaki Inoue, Hitachinaka (JP); Hideki Niwayama, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 115 days.

(21) Appl. No.: 16/036,434

(22) Filed: Jul. 16, 2018

(65) Prior Publication Data

US 2019/0067472 A1 Feb. 28, 2019

(30) Foreign Application Priority Data

Aug. 30, 2017 (JP) .................. 2017-165990

(51) Int. Cl.
*H01L 29/78* (2006.01)
*H01L 21/762* (2006.01)
(Continued)

(52) U.S. Cl.
CPC ........ *H01L 29/7823* (2013.01); *H01L 21/266* (2013.01); *H01L 21/26513* (2013.01); *H01L 21/26586* (2013.01); *H01L 21/823412* (2013.01); *H01L 21/823418* (2013.01); *H01L 27/0207* (2013.01); *H01L 27/088* (2013.01); *H01L 29/0611* (2013.01); *H01L 29/0653* (2013.01); *H01L 29/0865* (2013.01); *H01L 29/0882* (2013.01); *H01L 29/1033* (2013.01); *H01L 29/1095* (2013.01); *H01L 29/36* (2013.01); *H01L 29/42376* (2013.01); *H01L 29/6659* (2013.01); *H01L 29/66681* (2013.01); *H01L 29/66689* (2013.01); *H01L 29/7816* (2013.01); *H01L 21/0217* (2013.01); *H01L 21/0274* (2013.01); *H01L 21/2658* (2013.01); *H01L 21/28035* (2013.01); *H01L 21/28525* (2013.01); *H01L 21/31116* (2013.01); *H01L 21/324* (2013.01); *H01L 21/76224* (2013.01); *H01L 29/0696* (2013.01);
(Continued)

(58) Field of Classification Search
CPC ...................... H01L 29/66689; H01L 29/7823
See application file for complete search history.

(56) References Cited

U.S. PATENT DOCUMENTS

| 2010/0123196 A1* | 5/2010 | Cho .................. H01L 21/76802 257/343 |
| 2013/0087828 A1 | 4/2013 | Koshimizu et al. |

FOREIGN PATENT DOCUMENTS

| JP | 2011-100913 A | 5/2011 |
| WO | WO 2011/161748 | 12/2011 |

* cited by examiner

*Primary Examiner* — Jose R Diaz
(74) *Attorney, Agent, or Firm* — McDermott Will & Emery LLP

(57) ABSTRACT

A semiconductor device with improved performance. A channel region and a well region having a lower impurity concentration than the channel region are formed in a semiconductor substrate on the source region side of an LDMOS. The channel region partially overlaps a gate electrode in plan view. In the gate length direction of the LDMOS, an end of the well region in the channel region is at a distance from the end of the gate electrode on the source region side of the LDMOS in a manner to be away from the gate electrode.

19 Claims, 20 Drawing Sheets

(51) Int. Cl.
  *H01L 29/66*    (2006.01)
  *H01L 29/06*    (2006.01)
  *H01L 27/02*    (2006.01)
  *H01L 29/08*    (2006.01)
  *H01L 29/10*    (2006.01)
  *H01L 29/423*   (2006.01)
  *H01L 21/266*   (2006.01)
  *H01L 29/36*    (2006.01)
  *H01L 21/265*   (2006.01)
  *H01L 27/088*   (2006.01)
  *H01L 21/8234*  (2006.01)
  H01L 21/02     (2006.01)
  H01L 21/027    (2006.01)
  H01L 21/311    (2006.01)
  H01L 21/324    (2006.01)
  H01L 29/49     (2006.01)
  H01L 21/28     (2006.01)
  H01L 21/285    (2006.01)

(52) U.S. Cl.
  CPC .... *H01L 29/0878* (2013.01); *H01L 29/42368* (2013.01); *H01L 29/4916* (2013.01); *H01L 29/665* (2013.01)

SEMICONDUCTOR DEVICE AND METHOD FOR MANUFACTURING THE SAME

CROSS-REFERENCE TO RELATED APPLICATIONS

The disclosure of Japanese Patent Application No. 2017-165990 filed on Aug. 30, 2017 including the specification, drawings and abstract is incorporated herein by reference in its entirety.

BACKGROUND

The present invention relates to a semiconductor device and a method for manufacturing the same and more particularly to technology useful for a semiconductor device with an LDMOSFET.

An LDMOSFET (Laterally Diffused Metal Oxide Semiconductor Field Effect Transistor: hereinafter called LDMOS) is expected to mitigate the field strength on the drain region side of a gate electrode through a structure in which an end of the gate electrode on the drain region side is located over a thick oxide film formed in a semiconductor substrate. In this case, the LDMOSFET can have a higher breakdown voltage than an ordinary MISFET (Metal Oxide Semiconductor Field Effect Transistor).

For example, WO/2011/161748 discloses a technique that whereas an element isolating section has an STI (Shallow Trench Isolation) structure, the oxide film formed under an end of a gate electrode on the drain region side does not have an STI structure but has a LOCOS (LOCal Oxidation of Silicon) structure.

Japanese Unexamined Patent Publication No. 2011-100913 discloses a technique that a first body region is formed by ion implantation using a resist pattern, then a polysilicon film is formed over the first body region. In the technique, after that, the polysilicon film on the source region side is patterned by dry etching using another resist pattern as a mask and then a second body region and a source region are formed by ion implantation using the same resist pattern as a mask.

SUMMARY

In the LDMOS disclosed by WO/2011/161748, a p-type well region to configure the channel region of the LDMOS is formed by ion implantation or the like in advance. Then, a gate electrode is formed over the semiconductor substrate in a manner that the end of the gate electrode on the source region side is located more inward than the end of the p-type well region. At this time, patterning is done at the same manufacturing step for the gate electrode of the LDMOS and the gate electrode of a transistor in the vicinity of the LDMOS. For the gate electrode of the LDMOS, patterning is done at the same time for the drain region side end and the source region side end. Then, an impurity region to configure the source region is formed in the p-type well by ion implantation or the like.

The length of the channel region is almost determined by the position of the patterned gate electrode. In consideration of variation in masking and exposure accuracy in patterning, the end of the gate electrode must be at a sufficient distance from the end of the p-type well region. Therefore the p-type well region must be long enough, so the length of the channel region is often larger than the required length for characteristics.

Here, two neighboring LDMOSs share the p-type well region to configure a channel region, on the source region side. For this reason, the present inventors have explored a technique to decrease the area of the channel region and improve the performance of the LDMOS in order to miniaturize or reduce the size of the LDMOS.

In the LDMOS disclosed by Japanese Unexamined Patent Publication No. 2011-100913, the first body region and second body region are formed in a manner to overlap the gate electrode in plan view and used as a channel region of the LDMOS, which poses the problem that the on-resistance of the LMDOS may increase or the off-breakdown voltage of the LDMOS may decrease.

The above and further objects and novel features of the invention will more fully appear from the following detailed description in the present specification and the accompanying drawings.

According to one aspect of the invention, there are provided a semiconductor device and a method for manufacturing the same, in which the device includes a first channel region and a first well region having a lower impurity concentration than the first channel region which are formed in a semiconductor substrate on the first source region side of a first MISFET. The first channel region partially overlaps a first gate electrode of the first MISFET in plan view. In the gate length direction of the first MISFET, an end of the first well region in the first channel region is at a distance from the end of the gate electrode on the first source region side in a manner to be away from the first gate electrode.

According to the present invention, the performance of the semiconductor device can be improved.

DETAILED DESCRIPTION

Figure 1:
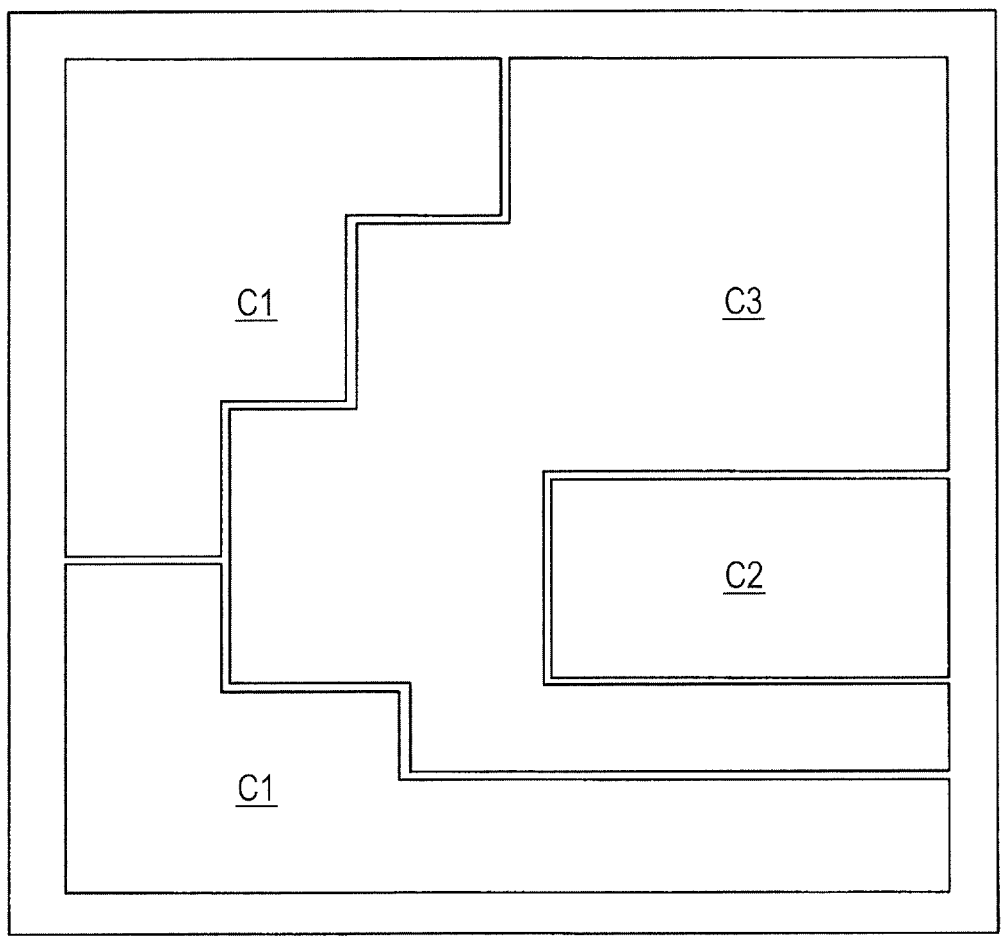
FIG. 1 is a circuit block diagram of a semiconductor device according to a first embodiment.

The preferred embodiments of the present invention will be described below in different sections or separately as necessary or for the sake of convenience, but the embodiments described as such are not irrelevant to each other unless otherwise stated. One embodiment may be, in whole or in part, a modified, detailed or supplementary form of another. Furthermore, in the preferred embodiments described below, when numerical information for an element (the number of pieces, numerical value, quantity, range, etc.) is given by a specific number, it is not limited to the specific number unless otherwise stated or theoretically limited to the specific number. It may be equal to, larger, or smaller than the specific number. Furthermore, in the preferred embodiments described below, constituent elements (including constituent steps) are not necessarily essential unless otherwise stated or considered theoretically essential. Similarly, in the preferred embodiments described below, when a specific form or positional relation is indicated for an element, it should be interpreted to include a form or positional relation which is substantially approximate or similar to the specific form or positional relation unless otherwise stated or theoretically limited to the specific form or positional relation. The same is true for the above numerical information and range.

Next, the preferred embodiments will be described in detail referring to drawings. In all the drawings that illustrate the preferred embodiments, the members with the same functions are designated by the same reference signs and description thereof is not repeated. As for the embodiments described below, basically the same or similar things or matters are not repeatedly described unless necessary.

In the drawings used to describe the embodiments, hatching may be omitted for easy understanding.

First Embodiment

FIG. 1 is a circuit block diagram which shows a rough layout of the semiconductor device according to the first embodiment.

The semiconductor device according to the first embodiment is, for example, a power IC (Power Integrated Circuit) for use in a hard disk drive. FIG. 1 shows circuit blocks C1 to C3 as areas in which semiconductor elements of circuits for various purposes are formed.

The circuit block C1 includes a driver circuit driven at a high voltage of 20 V or more and is an area in which an LDMOS as a high voltage MISFET is formed. The circuit block C1 is mainly used as a spindle motor driver (spindle driver), voice coil motor driver or power circuit (regulator) such as a negative power supply for a preamplifier.

The circuit block C2 includes a logic circuit driven at a voltage of about 1.5 V and is an area in which a low voltage MISFET which has a lower breakdown voltage and runs at higher speed than the LDMOS is formed as a semiconductor element.

The circuit block C3 includes an analog circuit and is an area in which a middle voltage MISFET having a breakdown voltage lower than the LDMOS and higher than the low voltage MISFET and driven at a voltage of about 6 V, a capacitive element, resistive element, bipolar transistor and the like are formed.

Figure 16:
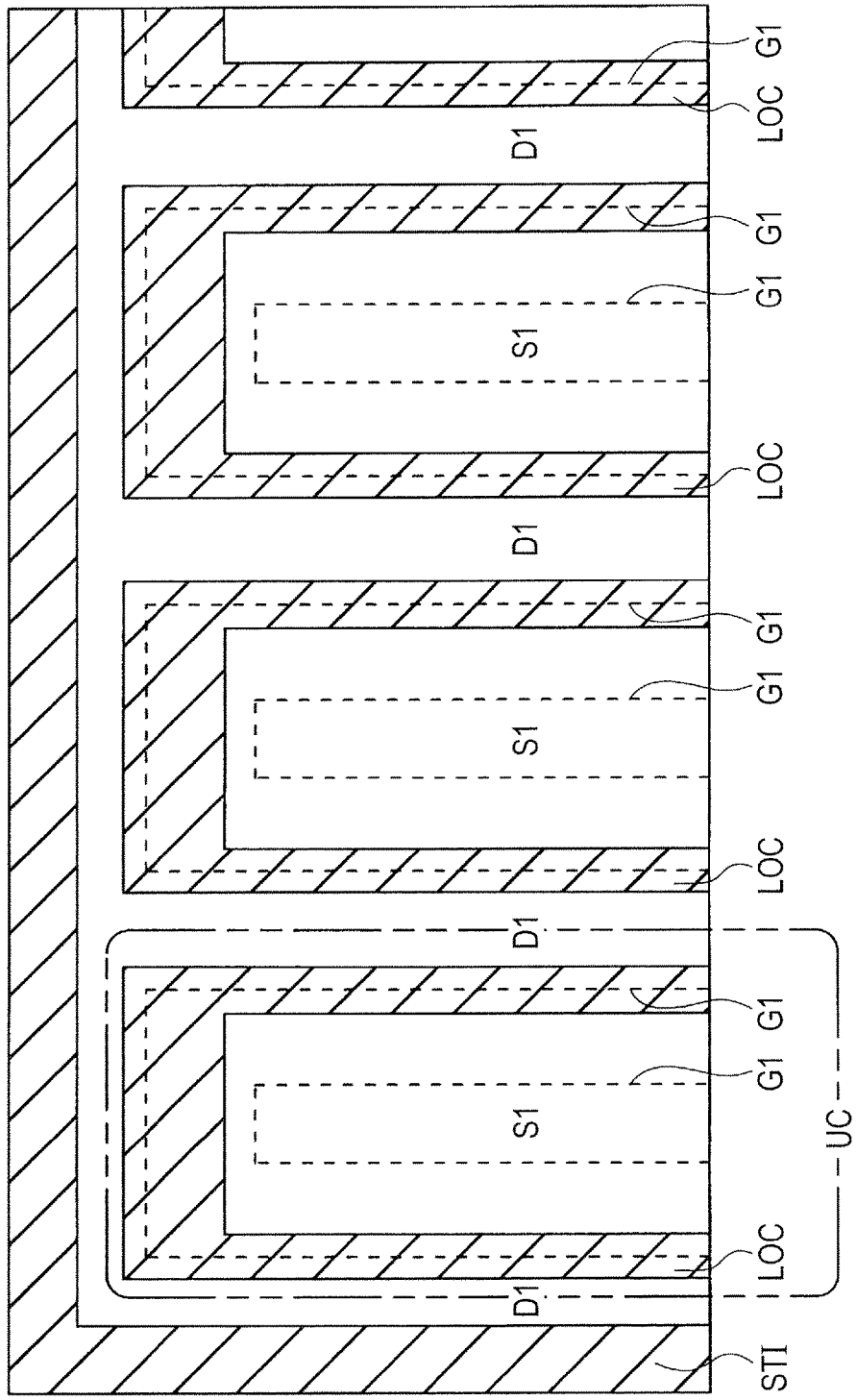
FIG. 16 is a plan view which shows part of a circuit block C1.

FIG. 16 is a plan view which partially shows the circuit block C1 in the present embodiment. Although FIG. 16 is a plan view, for easy understanding of the drawing, hatching is used to indicate an element isolating part STI and an insulating film LOC. In the figure, broken lines indicate a gate electrode G1, and a chain double-dashed line indicates a unit cell UC.

A plurality of LDMOSs are disposed over a semiconductor substrate SUB. In the present embodiment, two LDMOSs share a gate electrode G1 and a source region S1 and these two LDMOSs are referred to as a unit cell UC. FIG. 16 shows an example that two neighboring unit cells UC share a drain region D1, but instead the drain region D1 may be separated by an element isolating part STI for the unit cells UC.

Figure 17:
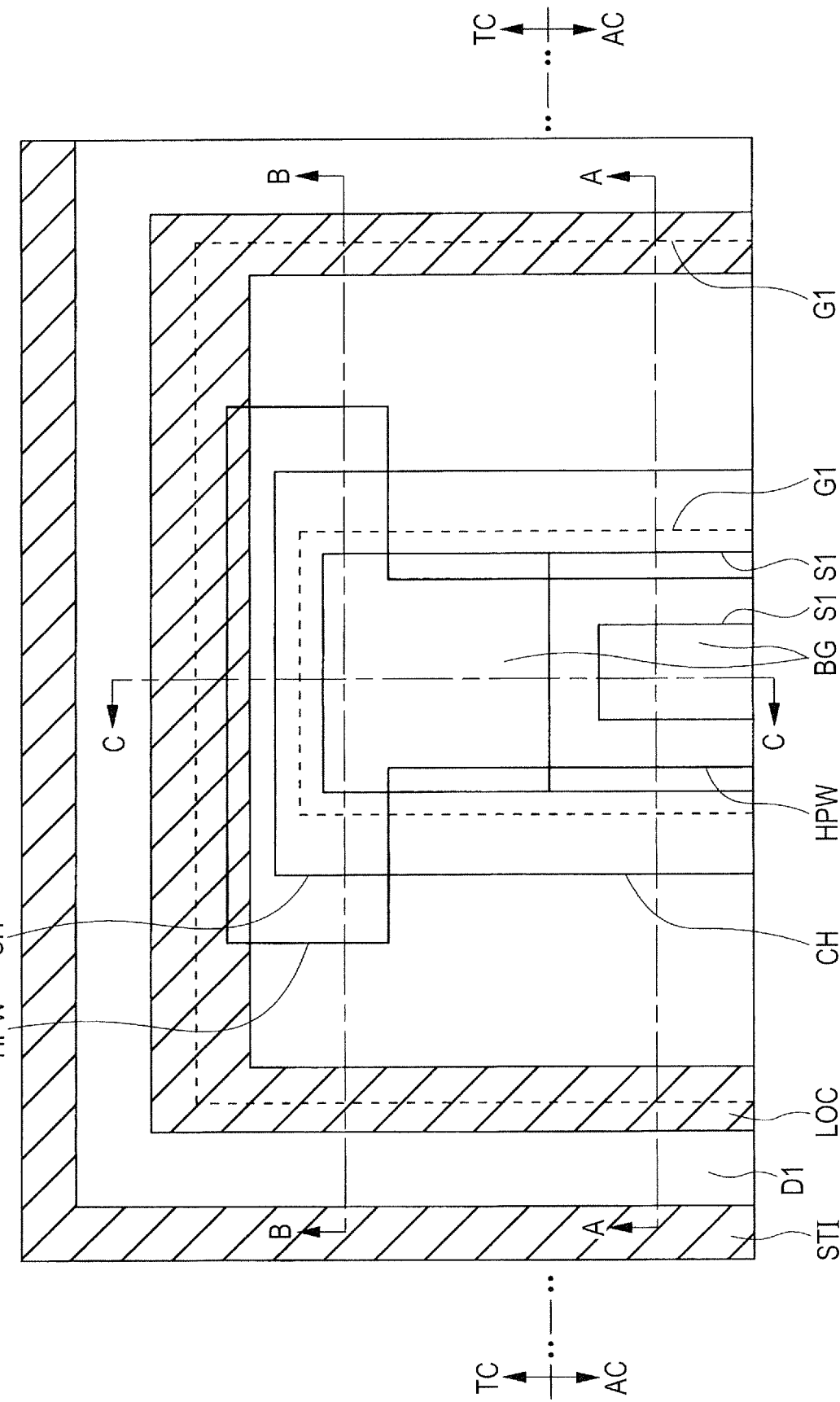
FIG. 17 is an enlarged view of the unit cell UC shown in FIG. 16.

FIG. 17 is an enlarged view of the unit cell UC shown in FIG. 16. The figure shows not only the gate electrode G1, element isolating part STI, and insulating film LOC but also a well region HPW, a channel region CH, a diffusion layer BG as a power supply region for the channel region CH, a diffusion layer S1 as part of the source region, and a diffusion layer D1 as part of the drain region. The unit cell UC is divided into an active area AC in which an LDMOS functions as a transistor, and a terminal area TC provided to improve the breakdown voltage, with the diffusion layer S1 as a boundary. In FIG. 17, the boundary between the active area AC and terminal area TC is indicated by a dashed double-dotted line. Although FIG. 17 is a plan view, the element isolating part STI and insulating film LOC are indicated by hatching for easy understanding of the drawing.

Figure 18:
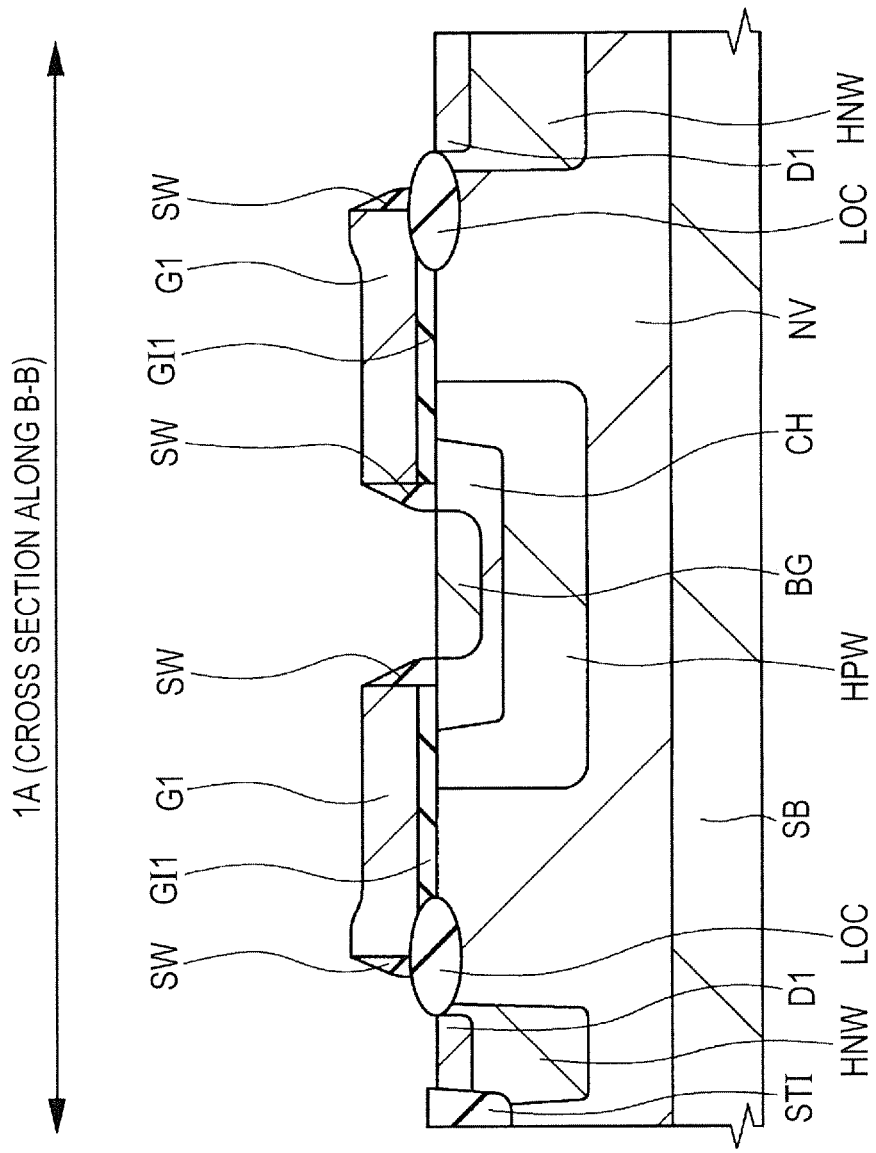
FIG. 18 is a sectional view taken along the line B-B in FIG. 17.
Figure 19:
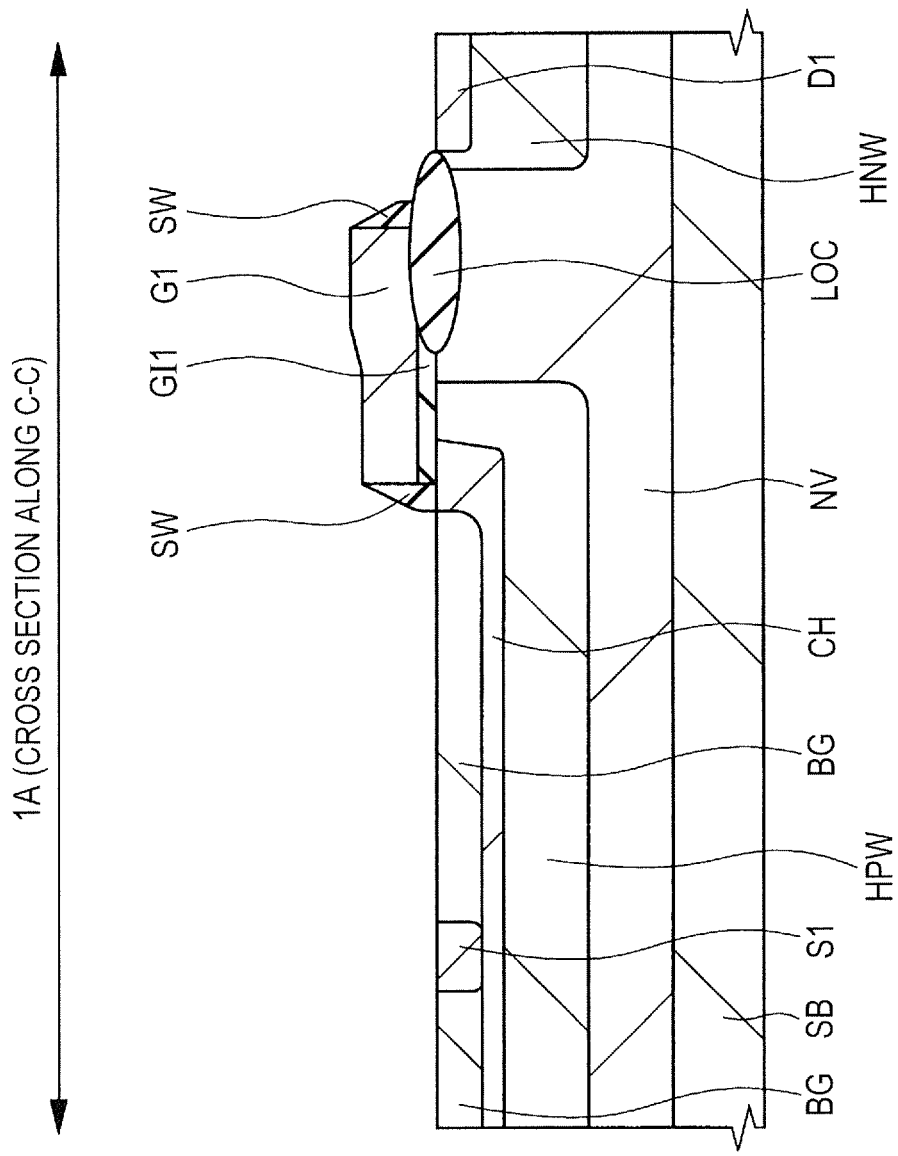
FIG. 19 is a sectional view taken along the line C-C in FIG. 17.

The line A-A in FIG. 17 is a line along which the sectional views FIGS. 2 to 13 are taken in the gate length direction of the LDMOS in the active area AC. The line B-B is a line along which the sectional view FIG. 18 is taken in the gate length direction of the LDMOS in the terminal area TC. The line C-C is a line along which the sectional view FIG. 19 is taken in the gate width direction of the LDMOS in the active area AC and terminal area TC.

In the explanation of the first embodiment, first the sectional structure of the active area AC along the line A-A in the gate length direction of the LDMOS will be described referring to FIGS. 2 to 13. Then, the positional relation between the gate electrode G1 and well region HPW of the LDMOS will be discussed referring to FIGS. 12, 14 and 15. Then, the terminal area TC of the LDMOS will be described referring to FIGS. 17 to 19.

Next, the semiconductor device and the method for manufacturing the same according to the present embodiment will be described referring to the sectional views FIGS. 2 to 13.

The area 1A shown in FIGS. 2 to 13 represents part of the circuit block C1 shown in FIG. 1 as an area in which two n-type LDMOSs are formed, as an example of a semiconductor element. FIGS. 2 to 13 are sectional views taken along the line A-A in FIG. 17.

The area 2A shown in FIGS. 2 to 13 represents part of the circuit block C2 shown in FIG. 1 as an area in which an n-type low voltage MISFET as an example of a semiconductor element is formed. In the circuit block C2, a p-type low voltage MISFET is also formed, but description of the p-type low voltage MISFET is omitted herein.

Figure 2:
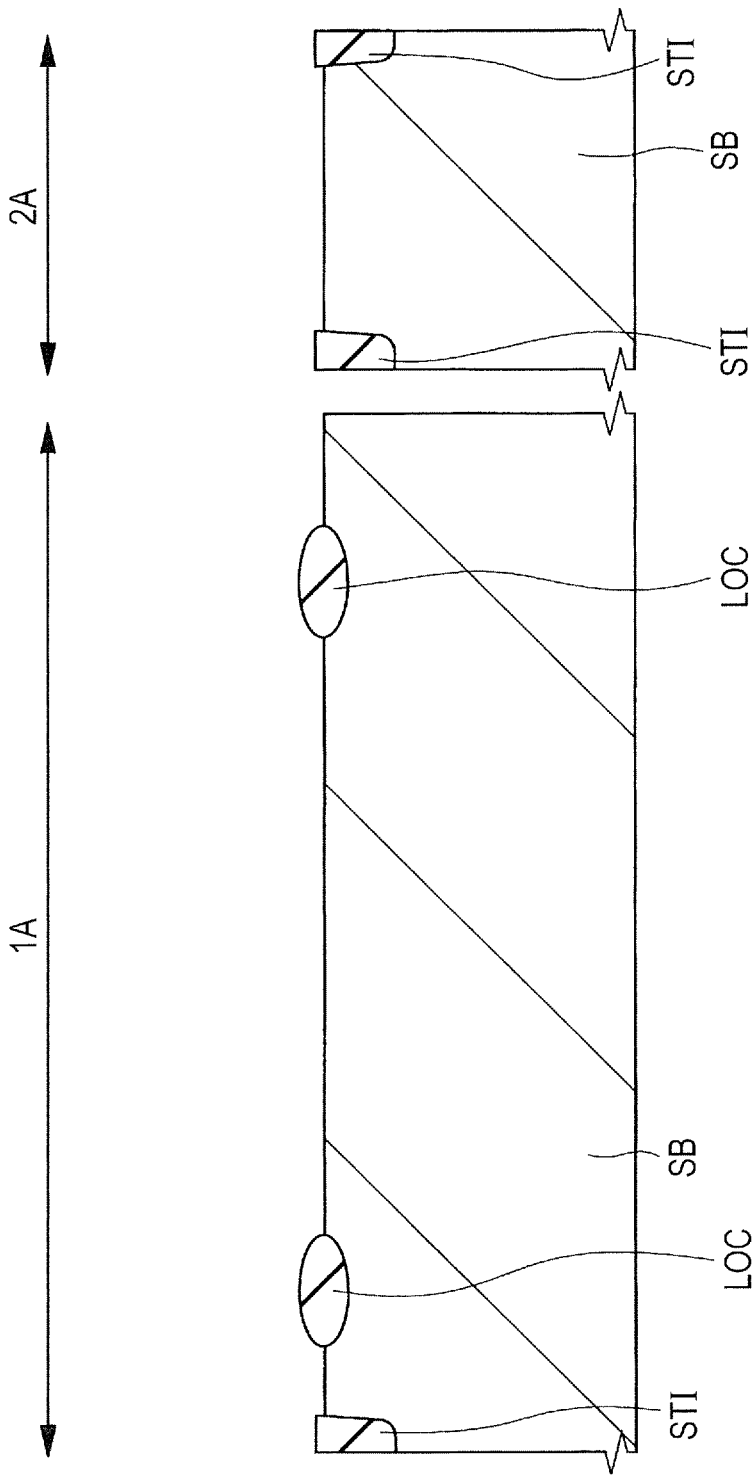
FIG. 2 is a sectional view which essentially shows a step in the process of manufacturing the semiconductor device according to the first embodiment.

First, as shown in FIG. 2, an element isolating part STI is formed in the semiconductor substrate SB in the areas 1A and 2A and then an insulating film LOC is formed in the area 1A.

Actually the semiconductor substrate SB has a laminated structure which includes, for example, a silicon support board and an epitaxial layer of, for example, silicon which is formed over the support board. In the description of the present embodiment, this laminated structure is called the semiconductor substrate SB.

The element isolating part STI is formed by selectively etching the semiconductor substrate SB using the photolithographic technique and dry etching technique or the like to make a plurality of trenches in the semiconductor substrate SB and then burying insulating film of, for example, silicon oxide in the trenches using the CMP (Chemical Mechanical Polishing) technique or the like. The element isolating part STI is mainly used to separate a plurality of semiconductor elements formed in the circuit blocks C1 to C3. The depth of the element isolating part STI (trench depth) is about 250 nm to 350 nm.

Next, the semiconductor substrate SB is partially exposed by covering the semiconductor substrate SB, for example, with insulating film of silicon nitride and selectively etching the insulating film using the photolithographic technique and dry etching technique or the like. Then, an insulating film LOC of, for example, silicon oxide is formed by thermal oxidation or the like in the region where the semiconductor substrate SB is exposed. Then, the insulating film of silicon nitride is removed. The insulating film LOC is mainly used to mitigate the electric field on the drain region side of the LDMOS. The thickness of the insulating film LOC is about 100 nm to 200 nm.

In description of the present embodiment, it is assumed that the insulating film formed on the drain region side of the LDMOS is an insulating film LOC; however, the insulating film formed on the drain region side of the LDMOS is not limited to an insulating film LOC and instead it may be an element isolating part STI. However, since the element isolating part STI has a larger depth than the insulating film LOC, it would excessively block the current pathway. Therefore, the use of the insulating film LOC on the drain region side of the LDMOS is preferable.

Figure 3:
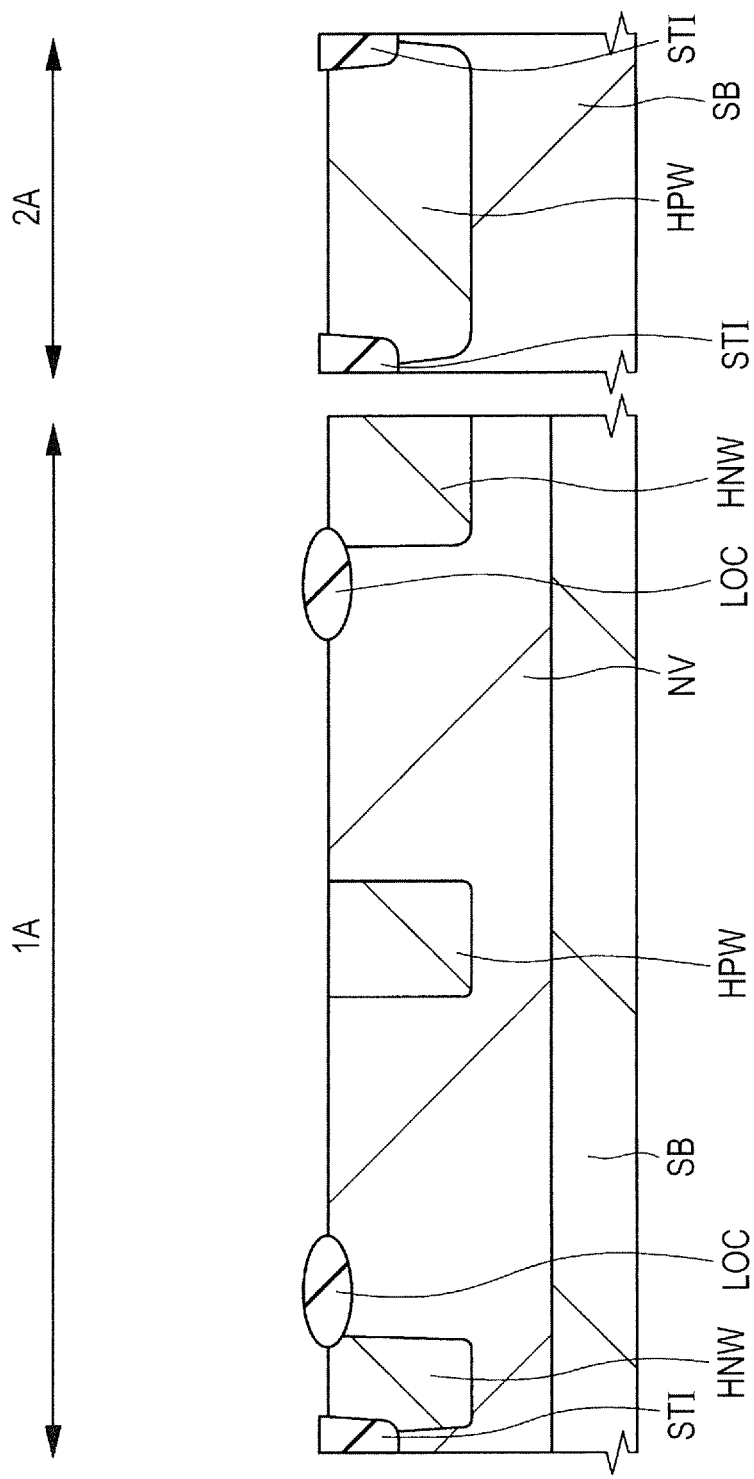
FIG. 3 is a sectional view which essentially shows a step following the step shown in FIG. 2 in the process of manufacturing the semiconductor device.

Next, as shown in FIG. 3, an n-type drift region NV (semiconductor region NV) is formed in the semiconductor substrate SB in the area 1A using the photolithographic technique and ion implantation technique or the like. Then, the drift region NV is diffused by performing heat treatment of the semiconductor substrate SB at high temperature for a long time. This heat treatment is performed, for example, at about 1100° C. for 60 minutes.

Next, using the photolithographic technique and ion implantation technique or the like, an n-type well region HNW (impurity region HNW) and a p-type well region HPW (impurity region HPW) are formed in the semiconductor substrate SB in the area 1A and a p-type well region HPW (impurity region HPW) is formed in the semiconductor substrate SB in the area 2A.

Here, the well region HPW in the area 1A and the well region HPW in the area 2A are formed through the same ion implantation process. This ion implantation process is divided into four steps and performed using boron (B) or boron difluoride ($BF_2$) for impurity ions with an implantation energy of about 60 to 200 keV and a dose of about $1.5 \times 10^{12}$ to $1.2 \times 10^{13}/cm^2$.

The first ion implantation step is performed using, for example, boron (B) with an implantation energy of about 200 keV and a dose of about $1.2 \times 10^{13}/cm^2$. The first ion implantation step is performed at a relatively high concentration, mainly for the purpose of preventing latch-up on the bottom of the well region HPW.

The second ion implantation step is performed using, for example, boron (B) with an implantation energy of about 120 keV and a dose of about $2.5 \times 10^{12}/cm^2$. The third ion implantation step is performed using, for example, boron (B) with an implantation energy of about 50 keV and a dose of about $1.5 \times 10^{12}/cm^2$. The second and third ion implantation steps are mainly performed in order to prevent transistor punch through.

The fourth ion implantation step is performed using, for example, boron difluoride ($BF_2$) with an implantation energy of about 60 keV and a dose of about $2.2 \times 10^{12}$ to $1.2 \times 10^{13}/cm^2$. The fourth ion implantation step is mainly performed in order to adjust the threshold of the low voltage MISFET.

The four ion implantation steps to form the well region HPW are performed by vertical ion implantation. For example, ions are implanted at an angle almost vertical to the semiconductor substrate SB. Here, "angle almost vertical" means an angle vertical to the semiconductor substrate SB or a tilting angle of 1 degree or less with respect to a vertical line to the semiconductor substrate SB. The angle of vertical ion implantation is smaller than the angle of oblique ion implantation which will be stated later.

After that, the impurities contained in the well region HPW and well region HNW are activated by heat treatment of the semiconductor substrate SB. This heat treatment is performed, for example, at about 950° C. for 60 seconds.

The n-type drift region NV and n-type well regions HNW in the area 1A configure part of the drain region of the LDMOS.

Figure 4:
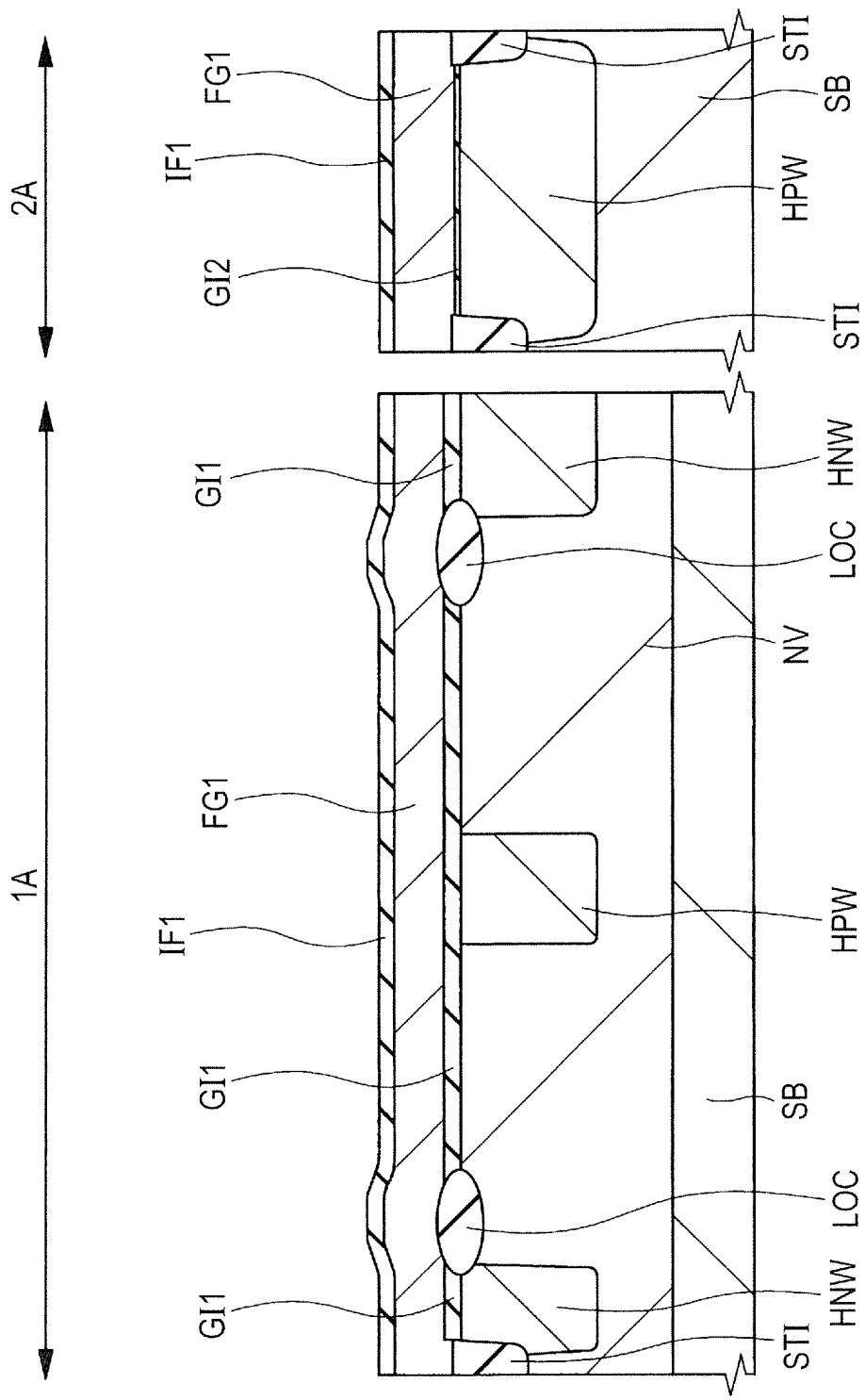
FIG. 4 is a sectional view which essentially shows a step following the step shown in FIG. 3 in the process of manufacturing the semiconductor device.

Next, as shown in FIG. 4, a gate insulating film GI1 and a gate insulating film GI2 are formed over the semiconductor substrate SB in the area 1A and area 2A by thermal oxidation or the like, respectively. The thickness of the gate insulating film GI1 is about 10 nm to 15 nm and larger than the thickness of the gate insulating film GI2. The thickness of the gate insulating film GI2 is about 2 nm to 4 nm.

One method for forming two types of gate insulating films with different thicknesses like this is explained below. First, a thick silicon oxide film is formed over the semiconductor substrate SB in the area 1A and area 2A by thermal oxidation. Then, the thick silicon oxide film in the area 2A is selectively removed using the photolithographic technique and wet etching technique. Then, a thin silicon oxide film is formed over the semiconductor substrate SB in the area 2A again by thermal oxidation. Thus, two types of gate insulating films with different thicknesses are formed.

Furthermore, a third type of gate insulating film may be formed by the same method as above for the middle voltage MISFET in the circuit block C3, though description thereof is omitted here.

Furthermore, a high-permittivity film, for example, of hafnium oxide or tantalum oxide, having a higher in permittivity than silicon oxide may be formed over the gate insulating film GI1 and gate insulating film GI2, for example, by the CVD (Chemical Vapor Deposition) technique so that this high-permittivity film is used as part of each of the gate insulating films GI1 and GI2.

Next, a conductive film FG1, for example, of polycrystalline silicon is formed over the gate insulating film GI1 and gate insulating film GI2, for example, by the CVD technique. Then, impurities are selectively implanted in the conductive film FG1 using the photolithographic technique and ion implantation technique so as to make the conductive film FG1 in the area 1A and area 2A an n-type film. The thickness of the conductive film FG1 is about 200 nm to 300 nm.

Next, an insulating film IF1, for example, of silicon oxide or silicon nitride is formed over the conductive film FG1, for example, by the CVD technique. The thickness of the insulating film IF1 is about 40 nn to 60 nm.

The conductive film FG1 is not limited to a polycrystalline silicon film but instead it may be a metal film or a laminated film including a polycrystalline silicon film and a metal film. Also, the insulating film IF1 may be a silicon oxynitride film.

Figure 5:
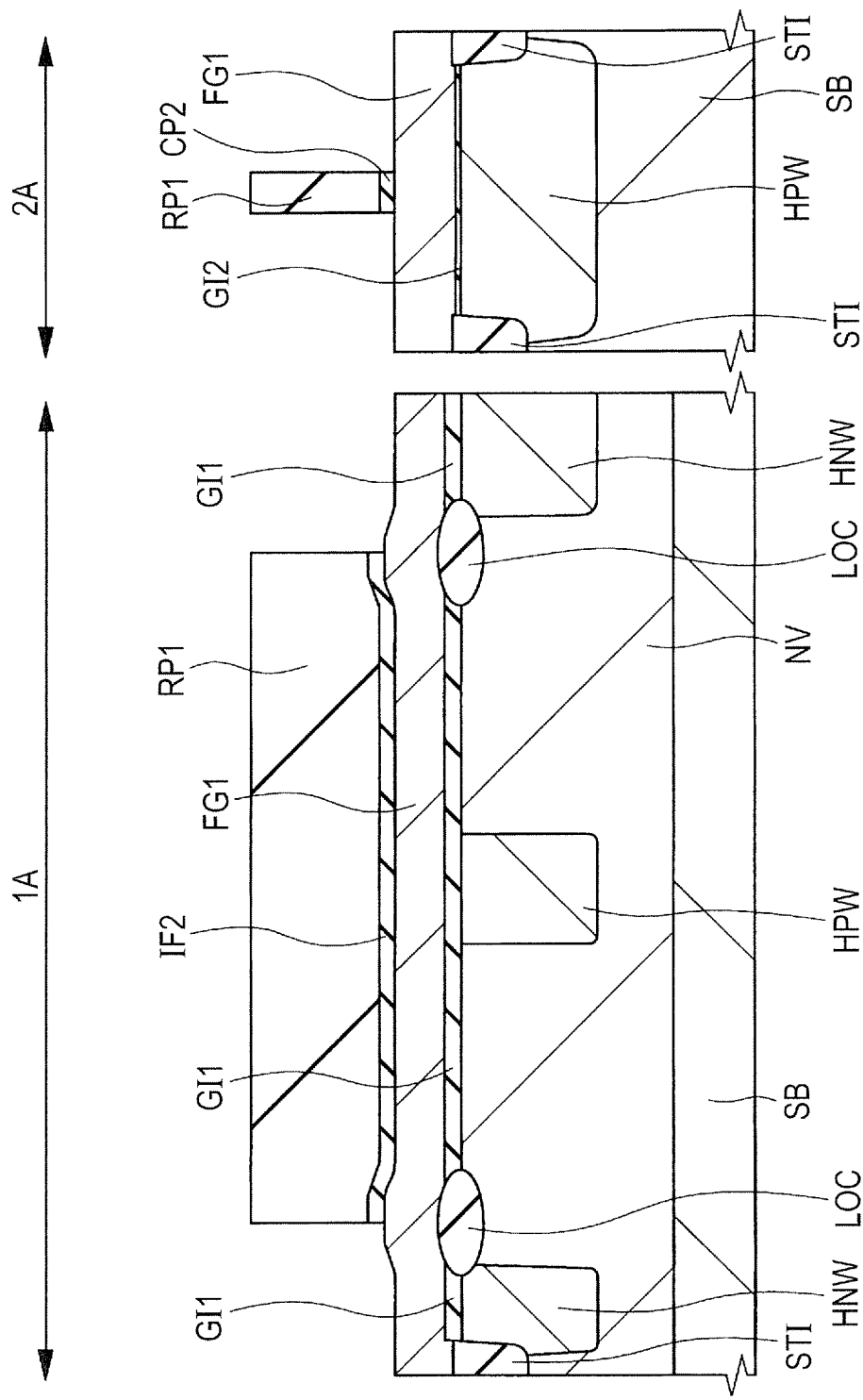
FIG. 5 is a sectional view which essentially shows a step following the step shown in FIG. 4 in the process of manufacturing the semiconductor device.

As shown in FIG. 5, a resist pattern RP1 is formed over the insulating film IF1 in the area 1A and area 2A. The resist pattern RP1 in the area 1A is formed in a manner to cover part of the gate electrode G1 to be formed at a later step and the resist pattern RP1 in the area 2A is formed in a manner to cover part of the gate electrode G2 to be formed at a later step. In other words, the resist pattern RP1 has a pattern which exposes (makes an opening in) the region to be the drain of the LDMOS in the area 1A and exposes the regions to be the drain and source of the low voltage MISFET in the area 2A.

Then, the insulating film IF1 portions exposed from the resist pattern RP1 are removed by dry etching. Consequently, in the area 1A an insulating film IF2 is formed over the conductive film FG1 and in the area 2A a cap film CP2 is formed over the conductive film FG1.

After that, the resist pattern RP1 is removed by ashing.

Figure 6:
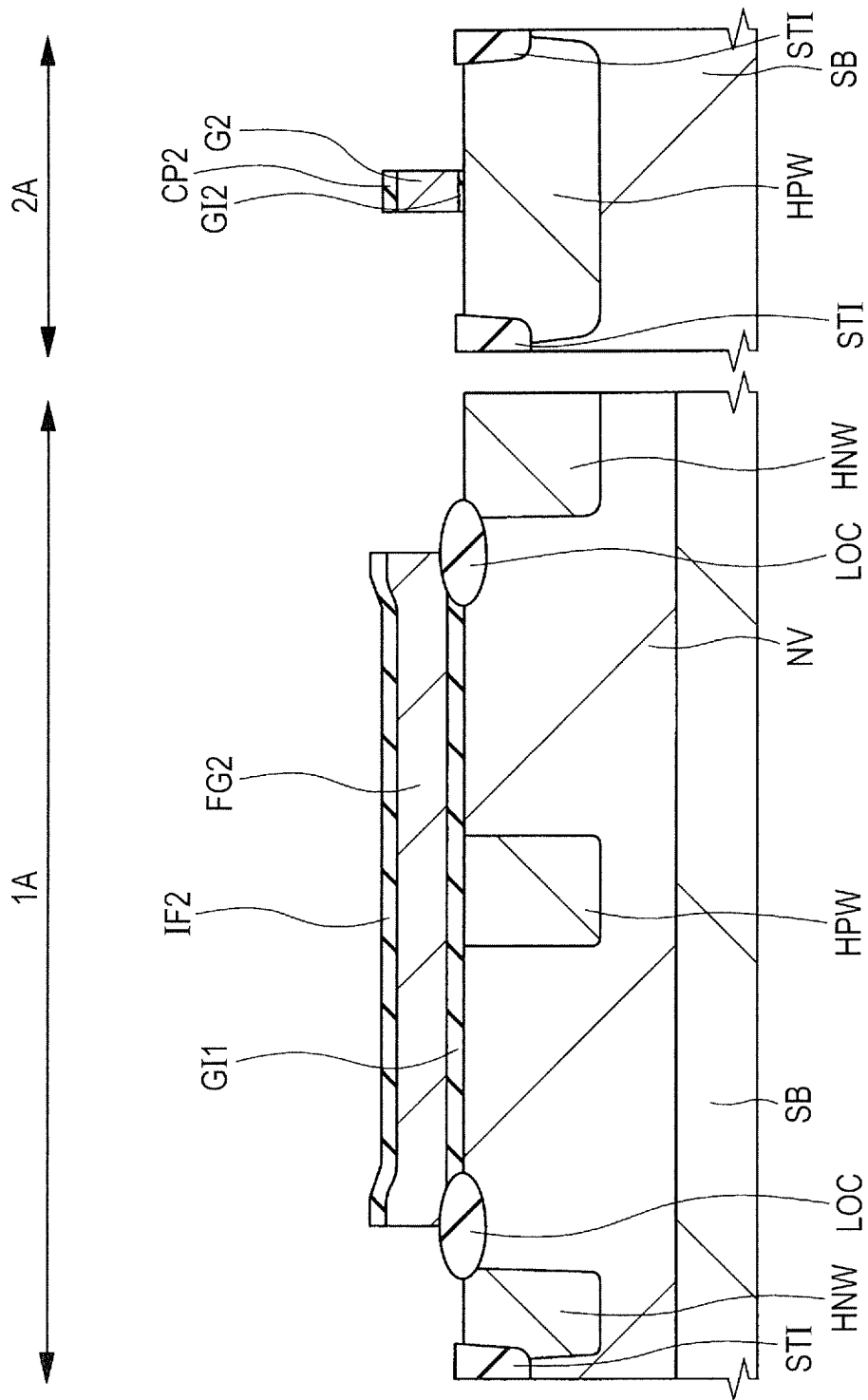
FIG. 6 is a sectional view which essentially shows a step following the step shown in FIG. 5 in the process of manufacturing the semiconductor device.

Next, as shown in FIG. 6, the conductive film FG1 in the area 1A and area 2A is selectively removed by dry etching in the presence of the selectively left insulating film IF2 and cap film CP2. Consequently, in the area 2A a gate electrode G2 is formed by processing the conductive film FG1 and in the area 1A a conductive film FG2 is formed by processing the conductive film FG1. In etching of the conductive film FG1, the gate insulating film GI1 is used as an etching stopper in the area 1A and the gate insulating film GI2 is used as an etching stopper in the area 2A.

Whereas in the area 2A the conductive film FG1 is processed so as to expose the drain region side and source region side of the low voltage MISFET, in the area 1A the conductive film FG1 is processed so as to expose only the drain region side of the LDMOS and not to expose the source region side of the LDMOS. At this time, the conductive film FG2 in the area 1A is not in the final form of the gate electrode G1 which will be described later, but in an intermediate form (first form).

At this step, in the circuit blocks C2 and C3 shown in FIG. 1, the conductive film FG1 is processed so that gate electrodes in the final form are formed like the gate electrode G2. For simplification of the description of the embodiment, illustration and detailed description of such gate electrodes are omitted here.

Figure 7:
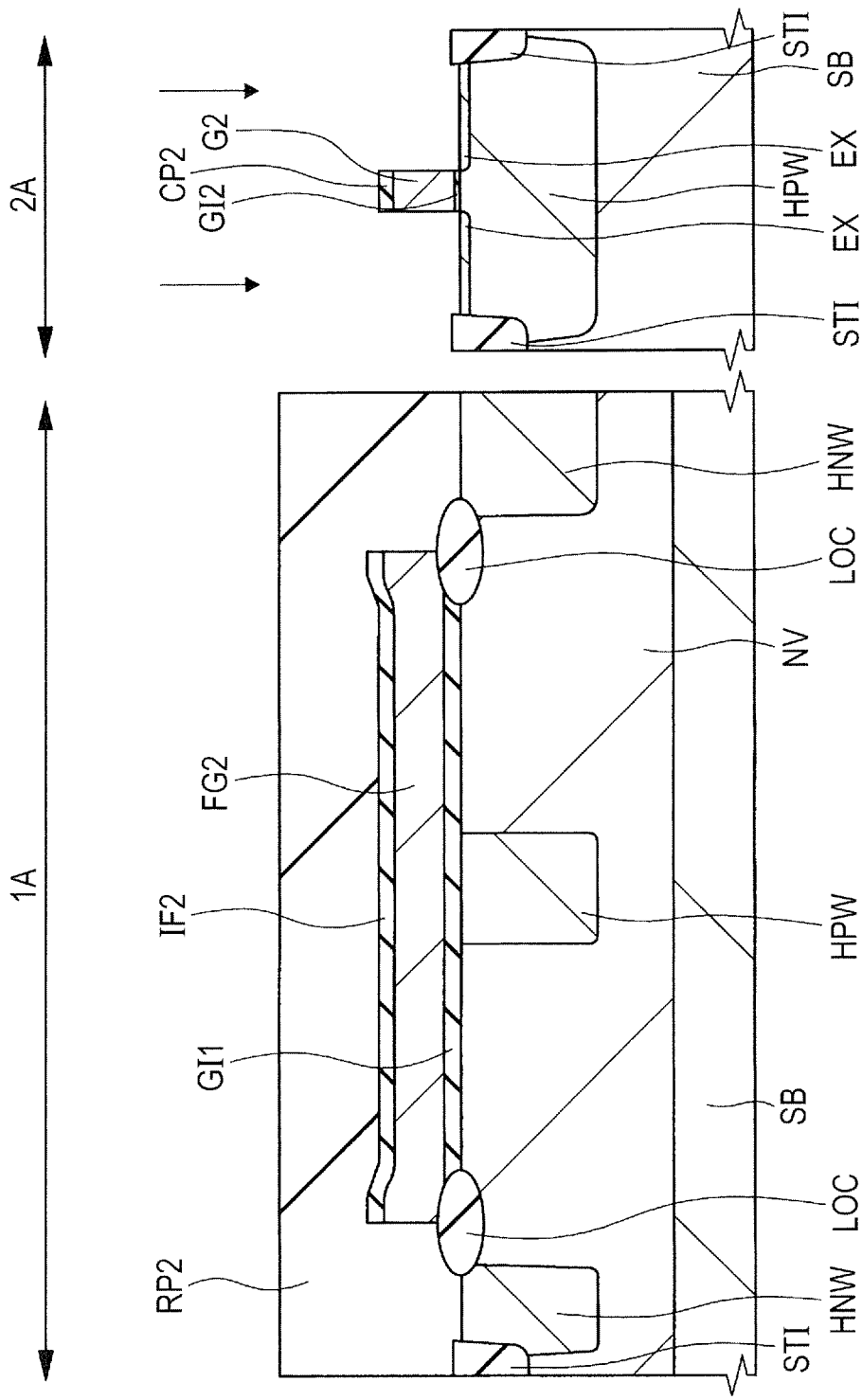
FIG. 7 is a sectional view which essentially shows a step following the step shown in FIG. 6 in the process of manufacturing the semiconductor device.

Next, as shown in FIG. 7, a resist pattern RP2 is formed to cover the area 1A and expose the area 2A. Then, an extension region EX of n-type conductivity (semiconductor region EX) is formed in the well HPW in the area 2A by ion implantation using the resist pattern RP2 as a mask. The extension region EX becomes part of the source region or drain region of the MISFET in the area 2A. For example, arsenic (As) is used for impurities to form the extension region EX, and for ion implantation, the energy is 5 to 10 keV and the dose is about $1\times10^{15}/cm^2$. In addition, a p-type halo region (not shown) may be formed in a manner to surround the extension region EX in the well region HPW.

After that, the resist pattern RP2 is removed by ashing.

Figure 8:
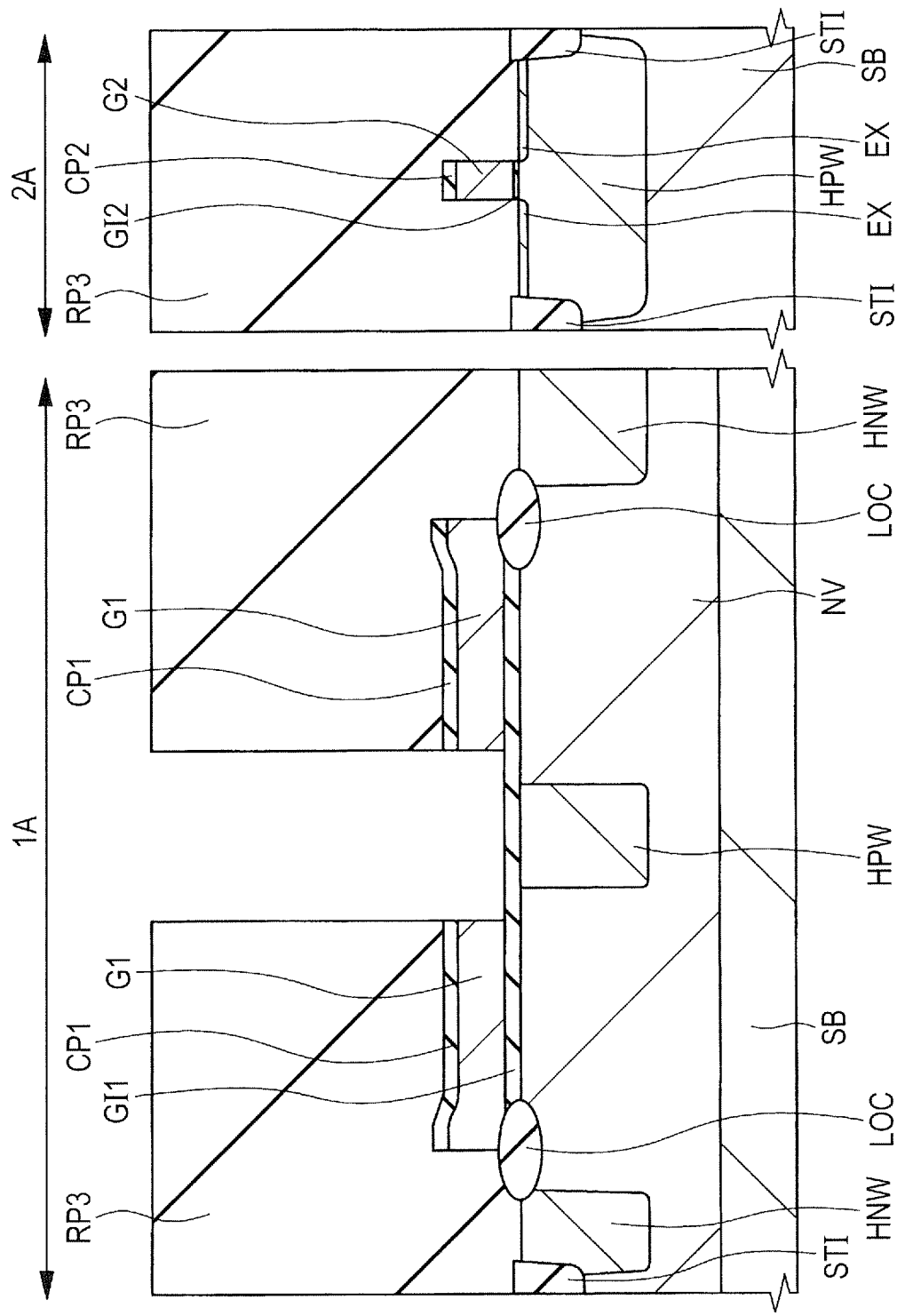
FIG. 8 is a sectional view which essentially shows a step following the step shown in FIG. 7 in the process of manufacturing the semiconductor device.

Next, as shown in FIG. 8, a resist pattern RP3 is formed to entirely cover the area 2A and partially expose the conductive film FG2 in the area 1A. Then, a cap film CP1 is formed in the area 1A by etching the insulating film IF2 using the resist pattern RP3 as a mask. Then, by etching the conductive film FG2 with the resist pattern RP3 left, the conductive film FG2 in the area 1A is processed into the final form (second form) in a manner to expose the source region side of the LDMOS. In short, a gate electrode G1 is formed in the area 1A by etching the conductive film FG2. In etching of the conductive film FG2, the gate insulating film GI1 in the area 1A is used as an etching stopper.

Next, the reason that the gate electrode G2 in the circuit block C2 and the gate electrodes in the circuit block C3 are formed only through the step shown in FIG. 6 without taking the step shown in FIG. 8 will be explained.

For example, it is assumed that only the source region side of the gate electrode G2 is processed at the step shown in FIG. 6 and the drain region side of the gate electrode G2 is processed at the step shown in FIG. 8. In that case, the size of the gate electrode G2 is defined by the position of the resist pattern RP1 in FIG. 5 and the position of the resist pattern RP3 in FIG. 8. Specifically, the position of the end of the gate electrode G2 on the drain region side is affected by variation in the accuracy of masking and exposure to form the resist pattern RP1 in FIG. 5 and then, the position of the end of the gate electrode G2 on the source region side is affected by variation in the accuracy of masking and exposure to form the resist pattern RP3 in FIG. 8. For this reason, it would be very difficult to achieve the design gate length. The length of the channel region is determined by the distance between the extension regions EX and the extension regions EX are formed in a manner to be aligned with the gate electrode G2. Therefore, when the gate length of the gate electrode G2 is smaller or larger, the length of the channel region would be smaller or larger. The present variation is not always the same among wafers. If that is the case, it is more likely that the length of the gate electrode G2 formed on the first wafer may be different from the length of the gate electrode G2 formed on the second wafer, so it would be impossible to achieve stability in the manufacture of semiconductor devices.

For example, the low voltage MISET in the circuit block C2 is a minute element in which the gate length of the gate electrode G2 is very small at 180 nm or less, so if the length of the gate electrode G2 varies, the length of the channel region would vary, which would largely affect the characteristics of the low voltage MISFET. For a MISFET of an analog circuit in the circuit block C3, accuracy of pair ratio must be considered and the influence of dimensional variation on characteristics is particularly significant. Therefore, it is preferable that processing for the gate electrode G2 in the circuit block C2 and the gate electrodes in the circuit block C3 should be performed only through the step shown in FIG. 6.

On the other hand, the LDMOS in the driver circuit block C1 is much larger in size than the low voltage MISFET in the circuit block C2 and has a gate length of 1.0 μm or more. Therefore, even if the size of the resist pattern RP3 shown in FIG. 8 to form the gate electrode G1 varies and thus the gate length of the gate electrode G1 varies, the characteristics of the LDMOS are hardly affected. Furthermore, as will be explained in detail later, in the LDMOS according to the present embodiment, after formation of the gate electrode G1 the channel region CH is formed in a self-aligning manner with respect to the gate electrode G1. Therefore, the length of the channel region CH is not affected by variation in the gate length of the gate electrode G1. For this reason, the process for the gate electrode G1 can be carried out through two steps, or the steps in FIG. 6 and FIG. 8.

Figure 9:
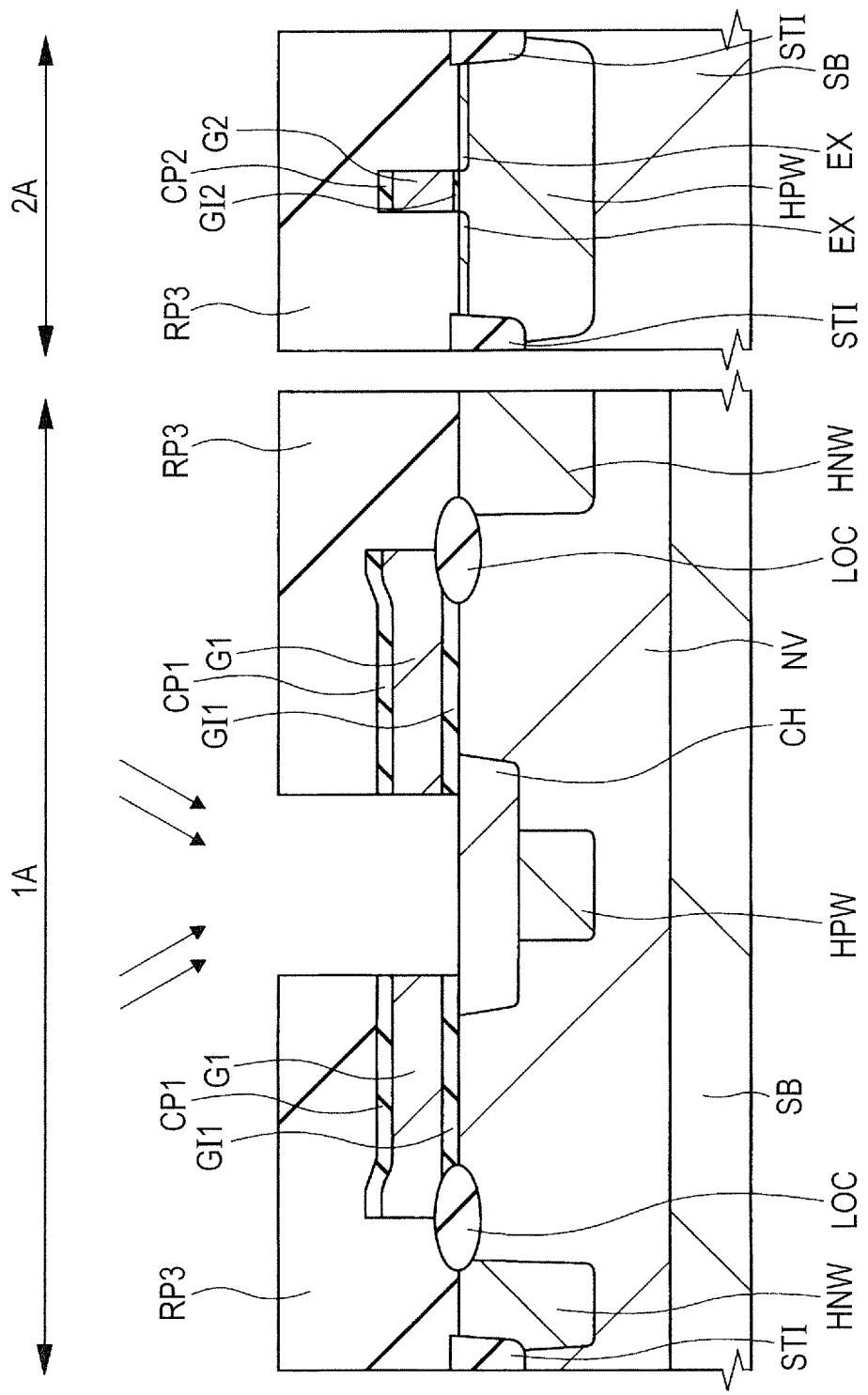
FIG. 9 is a sectional view which essentially shows a step following the step shown in FIG. 8 in the process of manufacturing the semiconductor device.

FIG. 9 shows a step following the step shown in FIG. 8 in the semiconductor device manufacturing method according to the present embodiment. As shown in FIG. 9, the resist pattern RP3 used at the step in FIG. 8 is left. At this step, a p-type conductivity channel region CH (semiconductor region CH) is formed in the area 1A by implanting impurity ions in the semiconductor substrate SB with the well region HPW in the area 1A formed therein, using the resist pattern RP3 as a mask. The impurity concentration of the p-type channel region CH is higher than the impurity concentration of the p-type well region HPW. For example, boron (B) is used for impurities to form the channel region CH, and for ion implantation, the energy is about 90 keV and the dose is about $5 \times 10^{12}$ to $2 \times 10^{13}/cm^2$. This ion implantation is performed by oblique ion implantation. For example, ions are implanted at a tilting angle of 20 degrees or more and 40 degrees or less with respect to a vertical line to the semiconductor substrate SB. The oblique ion implantation angle is larger than the above vertical ion implantation angle. This oblique ion implantation is carried out four times and the semiconductor substrate SB is turned by 90 degrees each time.

The channel region CH can be formed just under the gate electrode G1 by oblique ion implantation like this. In other words, the channel region CH partially overlaps the gate electrode G1 in plan view. Specifically, the end of the channel region CH is at a sufficient distance from the end of the gate electrode G1 on the source region side in the direction from the end of the gate electrode G1 on the source region side toward the drain region side of the gate electrode G1.

Another advantage is that since the channel region CH can be formed in a self-aligning manner with respect to the gate electrode G1, the length of the channel region CH in the gate length direction can be easily controlled to achieve the design length.

For example, in the related art disclosed by WO/2011/161748, the p-type well region HPW is formed as a channel region in advance and then the gate electrode G1 is formed by patterning. Therefore, the length of the channel region is almost determined by the position of the gate electrode G1 formed by patterning. In patterning, the influence of variation in the accuracy in masking and exposure is taken into consideration, so the end of the gate electrode must be at a sufficient distance from the end of the well region HPW. In other words, in consideration of variation in the position of the end of the gate electrode, the length of the well region HPW must be large enough, which necessitates the channel region length to be larger than the design value. This poses the problem that the on-resistance of the LDMOS cannot be minimized.

In contrast, in the manufacturing method according to the present embodiment, the gate electrode G1 is first formed before the channel region CH is formed in a self-aligning manner with respect to the gate electrode G1. Therefore, it is unnecessary for the length of the channel region CH to be larger than required in consideration of variation in patterning accuracy as mentioned above. In other words, in the present embodiment the length of the channel region CH can be smaller than in the related art. Thus, on-resistance of the LDMOS and the area of the LDMOS-array can be reduced. Thus, the size of the semiconductor device can be reduced and the performance of the semiconductor device can be improved.

Preferably the thickness of the resist pattern RP3 in FIG. 8 should be larger than the resist patterns used at the other steps (RP1, RP2, and RP4). The reason is that the thickness of the resist pattern RP3 is decreased at the etching step in FIG. 8 and if the thickness of the resist pattern RP3 is insufficient at the ion implantation step in FIG. 9, p-type impurities for formation of the channel region CH might be implanted in the n-type gate electrode G1. On the other hand, if the resist pattern RP3 is too thick, the problem that ion species cannot reach the semiconductor substrate SB due to the shadowing effect (shielding effect) of the resist pattern may arise during ion implantation in FIG. 9. Specifically, it is desirable that the thickness of the resist pattern RP3 be about 1.3 μm to 1.9 μm before the etching step in FIG. 8 and about 0.8 μm to 1.4 μm before the ion implantation step in FIG. 9. In other words, the thickness of the resist pattern RP3 before the etching step in FIG. 8 should be about 5 to 8 times larger than the thickness of the conductive film FG2 and the thickness of the resist pattern RP3 before the ion implantation step in FIG. 9 should be about 3 to 5 times larger than the thickness of the gate electrode G1. By adjusting the thickness of the resist pattern RP3 in this way, the introduction of unwanted impurities into the gate electrode G1 can be suppressed, thereby preventing deterioration in the performance of the semiconductor device.

In addition, the resist pattern RP3 shown in FIG. 8 is used not only to process the insulating film IF2 and the conductive film FG2 but also to form the channel region CH as shown in FIG. 9. This eliminates the need for an additional mask to form the channel region CH, which simplifies the manufacturing process and suppresses the increase in manufacturing cost.

The p-type well region HPW is designed at the step in FIG. 3 in advance not to be formed under the gate electrode G1. The well region HPW has a lower impurity concentration than the channel region CH and is intended to improve the breakdown voltage of the LDMOS. If in the gate length direction the length of the well region HPW is larger than the length of the channel region CH, the well region HPW would become part of the channel region of the LDMOS and the on-resistance of the LDMOS would increase. For this reason, the well region HPW is designed to have a smaller length in the gate length direction than the channel region CH and have a larger depth in the depth direction than the channel region CH.

Preferably in the gate length direction of the LDMOS, the distance between the end of the gate electrode G1 on the source side of the LDMOS and the end of the well region HPW should be 0.1 µm or more and 0.2 µm or less. This distance will be discussed in detail later referring to FIGS. 14 and 15.

After formation of the channel region CH, the resist pattern RP3 is removed by ashing.

Figure 10:
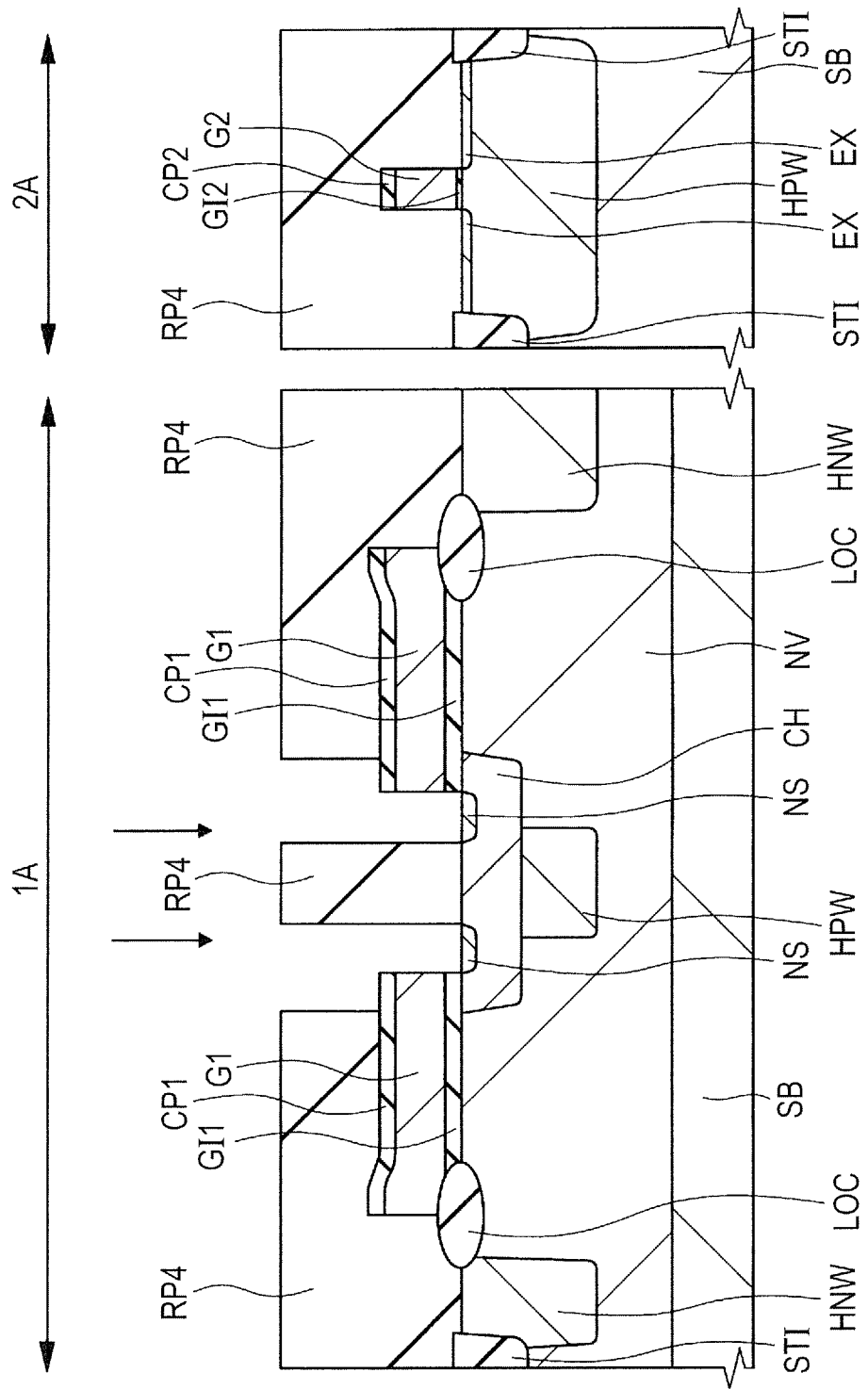
FIG. 10 is a sectional view which essentially shows a step following the step shown in FIG. 9 in the process of manufacturing the semiconductor device.

Next, as shown in FIG. 10, a resist pattern RP4 is formed to cover the area 2A and partially expose the channel region CH in the area 1A. Then, an n-type conductivity impurity region NS (semiconductor region NS) is formed by implanting impurities in the channel region CH by the ion implantation technique using the resist pattern RP4 as a mask. The impurity region NS becomes part of the source region of the LDMOS. In order to form the impurity region NS, for example, arsenic (As) is used for impurities, and for ion implantation, the energy is about 60 keV and the dose is about $2 \times 10^{14}$ to $6 \times 10^{14}/cm^2$. The vertical ion implantation technique for the step of forming the well region HPW as explained above in reference to FIG. 3 is used for ion implantation to form the impurity region NS.

Due to the use of the vertical ion implantation technique as mentioned above, the impurity region NB is formed in the channel region CH in a manner to be virtually aligned with the gate electrode G1. Specifically, in the gate length direction, the ends of the impurity region NS are positioned so as not to reach the drift region NV beyond the ends of the channel region CH.

Though not shown, the ion implantation technique for formation of the impurity region NS may be used to form not only the source region of the LDMOS in the circuit block C1 but also, for example, the source region and drain region of the middle voltage MINSFET in the circuit block C3.

Then, the impurities contained in the extension region EX, impurity region NS, and channel region CH are activated by heat treatment of the semiconductor substrate SB. This heat treatment is performed, for example, at about 950° C. for ten seconds.

After that, the resist pattern RP4 is removed by ashing.

Figure 11:
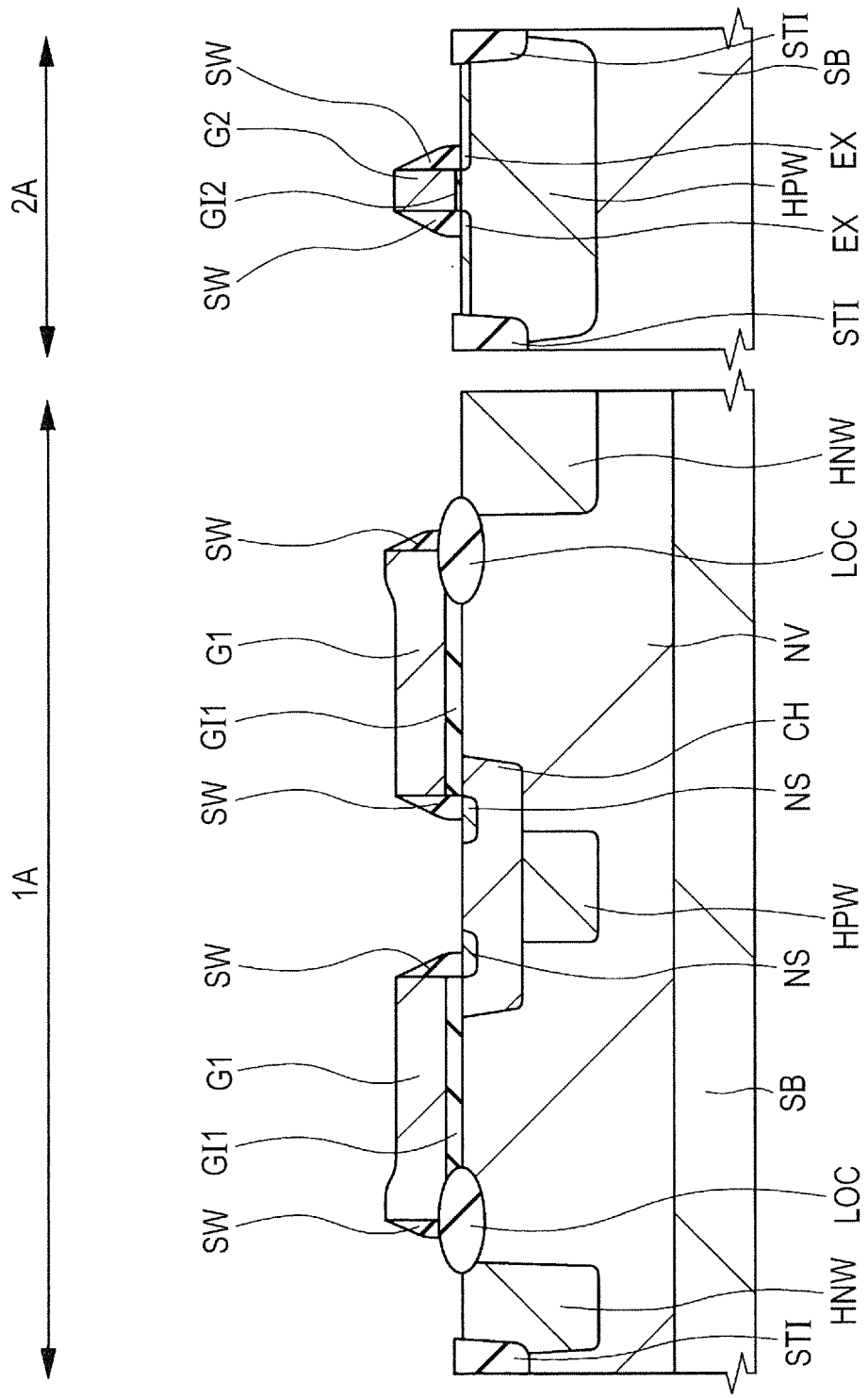
FIG. 11 is a sectional view which essentially shows a step following the step shown in FIG. 10 in the process of manufacturing the semiconductor device.

Next, as shown in FIG. 11, sidewall spacers SW are formed over the side faces of the gate electrode G1 and gate electrode G2. The sidewall spacers SW are formed as follows. First, in the area 1A and area 2A, an insulating film, for example, of silicon oxide is formed in a manner to cover the gate electrode G1, gate electrode G2, cap film CP1, and cap film CP2. Then, the insulating film is anisotropically etched to form sidewall spacers SW over the side faces of the gate electrode G1 and gate electrode G2. The cap film CP1 and cap film CP2 are removed by anisotropic etching.

Figure 12:
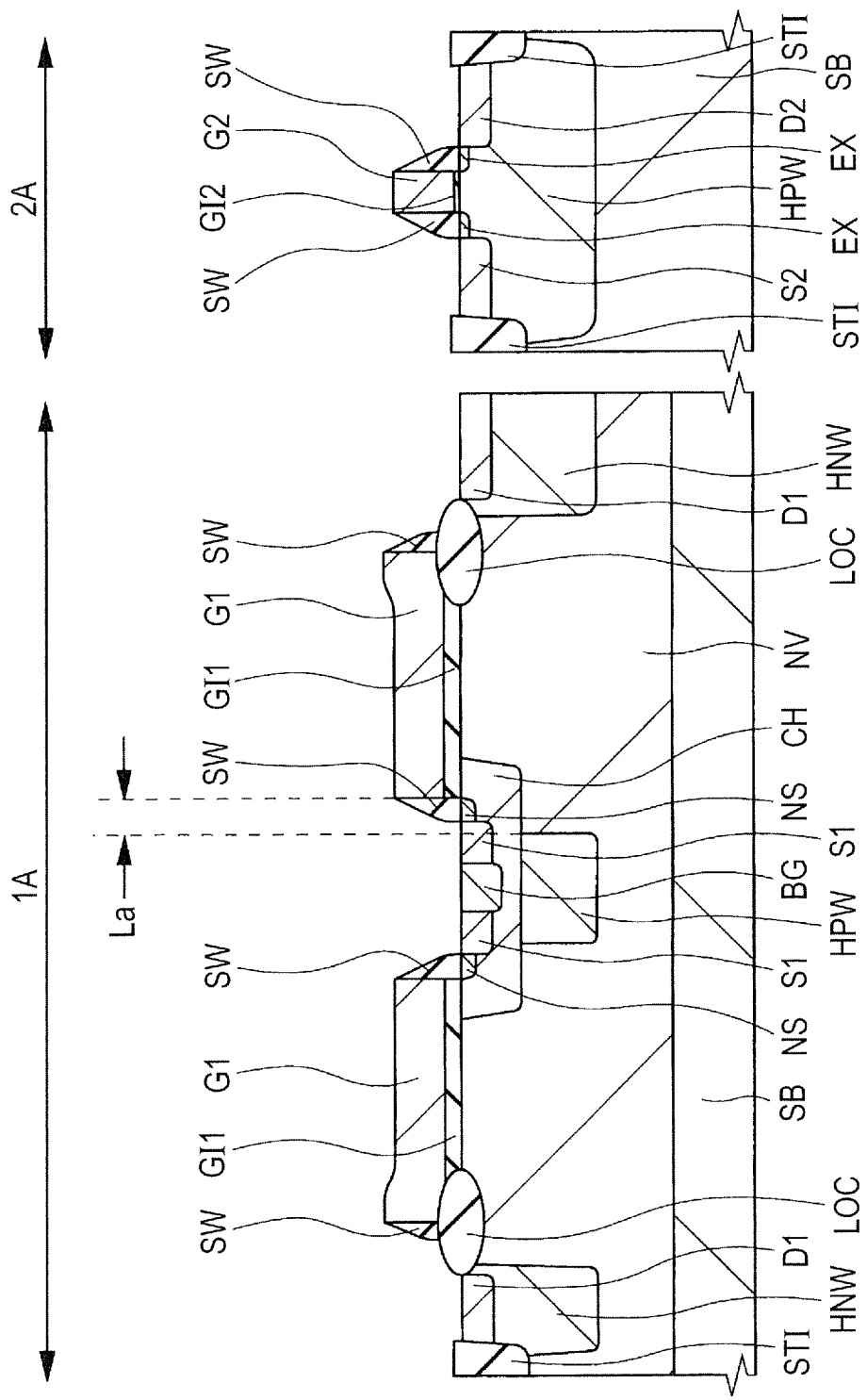
FIG. 12 is a sectional view which essentially shows a step following the step shown in FIG. 11 in the process of manufacturing the semiconductor device.

Next, as shown in FIG. 12, using the photolithographic technique and ion implantation technique or the like, an n-type conductivity diffusion layer D1 (semiconductor region D1) and diffusion layer S1 (semiconductor region S1) are formed in the area 1A and an n-type conductivity diffusion layer D2 (semiconductor region D2) and diffusion layer S2 (semiconductor region S2) are formed in the area 2A. In the area 1A, the diffusion layer S1 formed in the channel region CH and in contact with the impurity region NS configures part of the source region of the LDMOS and the diffusion layer D1 formed in the well region HNW configures part of the drain region of the LDMOS. In the area 2A, the diffusion layer S2 configures part of the source region of the low voltage MISFET and the diffusion layer D2 configures part of the drain region of the low voltage MISFET.

The impurity concentration of the diffusion layer S1 is higher than the impurity concentration of the impurity region NS, the impurity concentration of the diffusion layer D1 is higher than the impurity concentration of the well region HNW, and the impurity concentration of each of the diffusion layer S2 and diffusion layer D2 is higher than the impurity concentration of the extension region EX. For example, arsenic (As) and phosphorus (P) are used for impurities to form the diffusion layer S1, diffusion layer D1, diffusion layer S2, and diffusion layer D2.

Next, a p-type conductivity diffusion layer BG (semiconductor region BG) is formed in the area 1A using the photolithographic technique and ion implantation technique or the like. The diffusion layer BG is conductive with the channel region CH and serves as a power supply region to apply a potential to the channel region CH. For example, boron difluoride ($BF_2$) and boron (B) are used for impurities to form the diffusion layer BG.

Next, the impurities contained in the diffusion layer S1, diffusion layer D1, diffusion layer S2, diffusion layer D2, and diffusion layer BG are activated by heat treatment of the semiconductor substrate SB. This heat treatment is performed, for example, at about 950° C. for 10 seconds.

Figure 13:
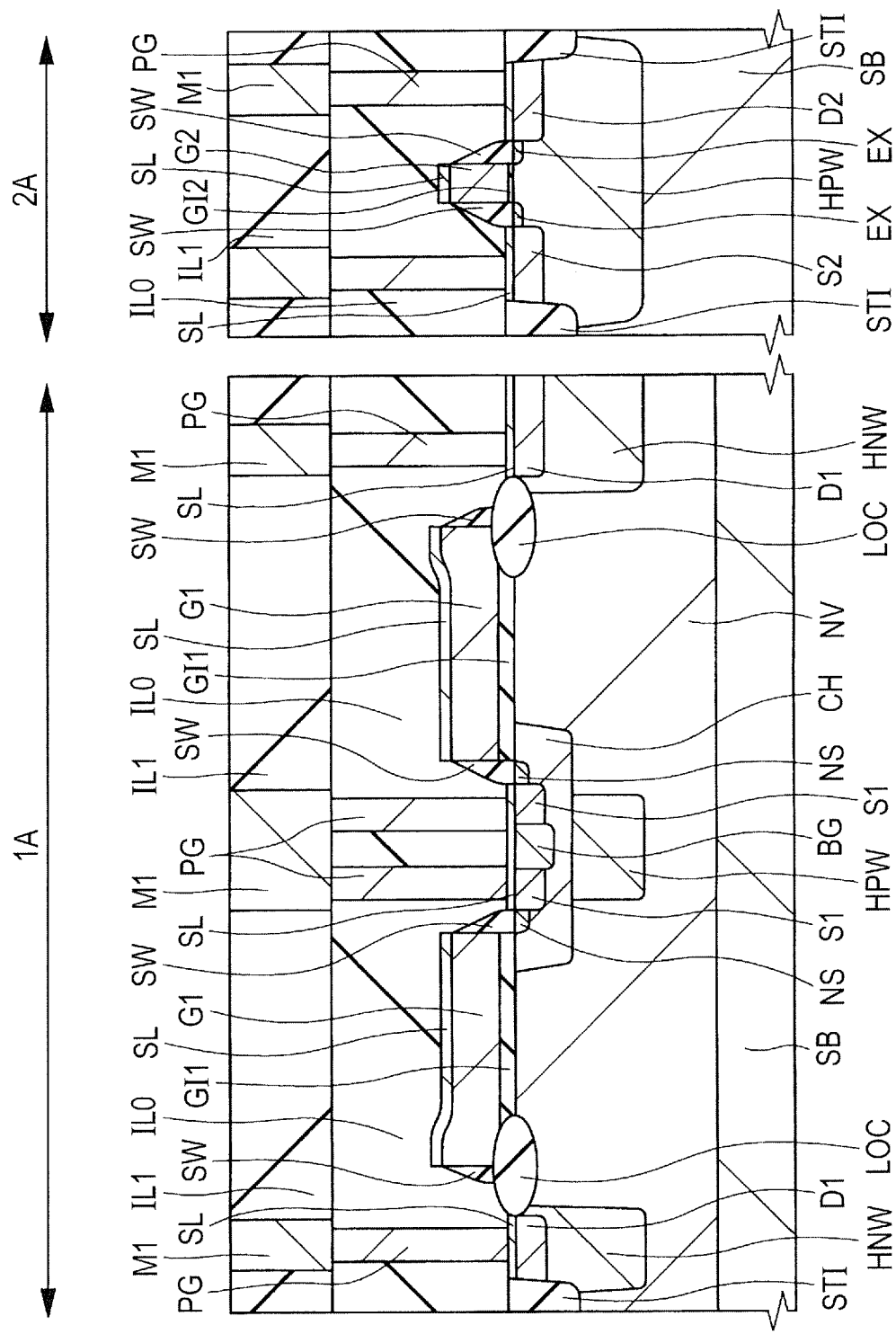
FIG. 13 is a sectional view which essentially shows a step following the step shown in FIG. 12 in the process of manufacturing the semiconductor device.

Next, as shown in FIG. 13, a low-resistance silicide film SL is formed over each of the diffusion layer S1, diffusion layer D1, diffusion layer BG, diffusion layer S2, diffusion layer D2, gate electrode G1, and gate electrode G2 by the Salicide (Self Aligned Silicide) technique.

Concretely the silicide film SL can be formed as follows. A metal film for formation of the silicide film SL is formed in the area 1A and area 2A. This metal film is, for example, made of cobalt, nickel, or nickel-platinum alloy. Then, the diffusion layer S1, diffusion layer D1, diffusion layer BG, diffusion layer S2, diffusion layer D2, gate electrode G1, and gate electrode G2 are made to react with the metal film by heat treatment of the semiconductor substrate SB to form the silicide film SL. After that, the unreacted portion of the metal film is removed. The formation of the silicide film SL decreases the diffusion resistance and contact resistance in the diffusion layer S1, diffusion layer D1, diffusion layer BG, diffusion layer S2, diffusion layer D2, gate electrode G1, and gate electrode G2.

By taking the above steps, the LDMOS in the area 1A and the low voltage NISFET in the area 2A are produced.

Next, an interlayer insulating film IL0 is formed in the area 1A and area 2A. The interlayer insulating film IL0 may be a single-layer film of silicon oxide or a laminated film including a silicon nitride film and a thick silicon oxide film lying over the silicon nitride film. After formation of the interlayer insulating film IL0, the upper surface of the interlayer insulating film IL0 may be polished by the CMP technique as necessary.

Then, a contact hole is made in the interlayer insulating film IL0 using the photolithographic technique and dry etching technique or the like and a conductive film, for example, of tungsten (W) is buried in the contact hole to form a plug PG in the interlayer insulating film IL0. A plurality of such plugs PG are formed and the plugs PG are coupled to the silicide films SL.

Then, an interlayer insulating film IL1 is formed over the interlayer insulating film IL0 in which the plugs PG are buried. After that, a trench for wiring is made in the interlayer insulating film IL1 and a conductive film containing copper as a main component is buried in the trench for wiring to form, in the interlayer insulating film IL1, a first layer wiring M1 to be coupled to a plug PG. The structure of this wiring M1 is called the damascene wiring structure.

After that, second and subsequent layer wirings are formed by the dual damascene technique or the like, though illustration and description of such wirings are omitted here. The structure of the wiring M1 and wirings lying over the wiring M1 is not limited to the damascene wiring structure; instead they may be, for example, tungsten wirings or aluminum wirings which are formed by patterning a conductive film.

The semiconductor device according to the present embodiment is manufactured as mentioned above.

<Positional Relation Between the Gate Electrode G1 and the Well Region HPW>

Figure 14:
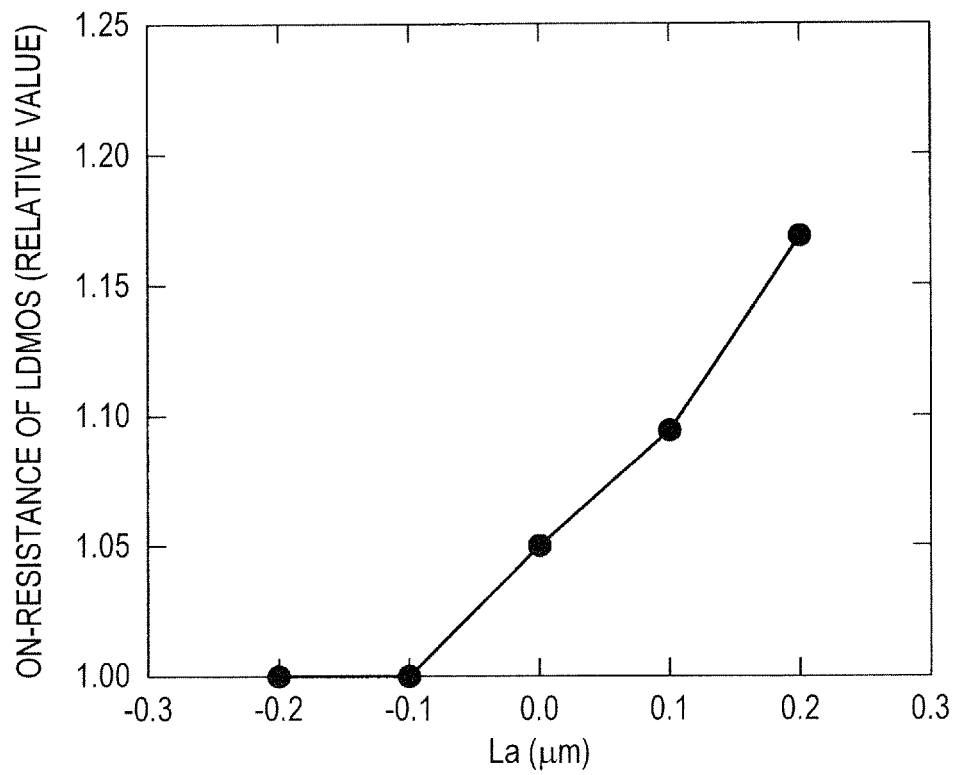
FIG. 14 is a graph which shows the result of a test by the present inventors.
Figure 15:
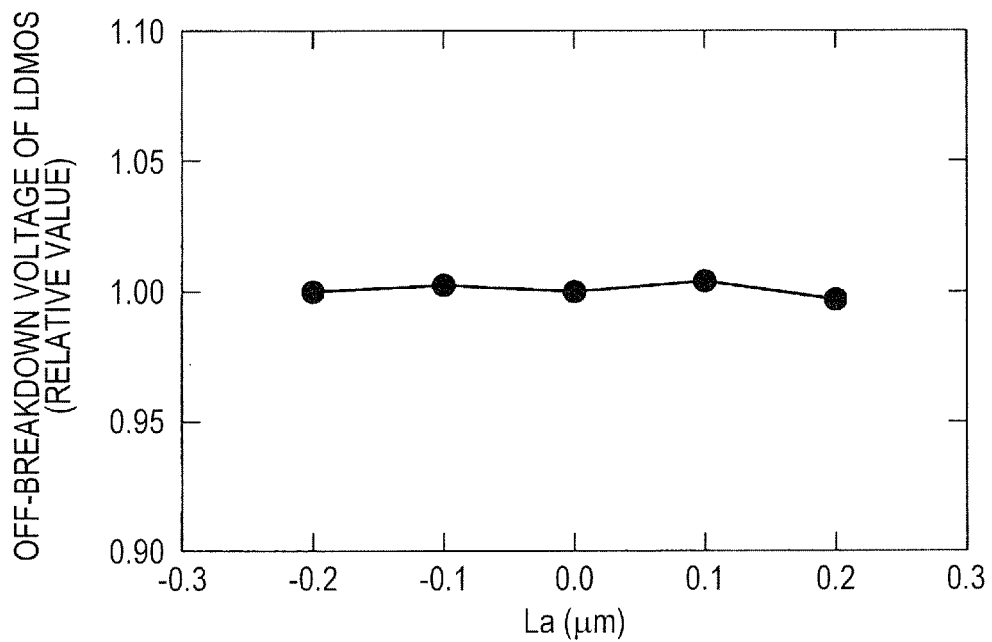
FIG. 15 is a graph which shows the result of a test by the present inventors.

FIGS. 14 and 15 show test data obtained in the study by the present inventors concerning the positional relation between the gate electrode G1 and well region HPW. The test data obtained in the study by the present inventors is explained below using FIGS. 14 and 15 and length La in the LDMOS shown in FIG. 12.

Length La represents a distance in the channel region CH in the gate length direction of the LDMOS and a distance by which the gate electrode G1 and the well region HPW overlap in plan view. In other words, length La represents the shortest distance from the end of the gate electrode G1 on the source side of the LDMOS to the end of the well region HPW in the gate length direction of the LDMOS.

FIG. 14 shows the relation between length La and the on-resistance of the LDMOS.

In the horizontal axis of FIG. 14, La=0.0 means that in the gate length direction of the LDMOS, the end of the gate electrode G1 on the source side of the LDMOS coincides with the end of the well region HPW.

In the horizontal axis of FIG. 14, La>0.0 means that in the gate length direction of the LDMOS, the well region HPW extends to under the gate electrode G1, in which La represents the distance by which the gate electrode G1 and the well region HPW overlap in plan view. In short, the channel region CH and well region HPW are formed as the channel of the LDMOS.

In the horizontal axis of FIG. 14, La<0.0 means that the gate electrode G1 and the well region HPW do not overlap in plan view, in which La represents the distance between the end of the gate electrode G1 on the source side of the LDMOS and the end of the well region HPW in the gate length direction of the LDMOS.

The vertical axis of FIG. 14 expresses an increase or decrease in the on-resistance of the LDMOS, relative to the reference value 1.00. In short, a value on the vertical axis of FIG. 14 is a relative value.

As shown in FIG. 14, as length La changes toward the direction of La>0.0, the on-resistance of the LDMOS increases and as length La changes toward La<0.0, the on-resistance of the LDMOS decreases. More specifically, when length La is larger than −0.1 μm, the on-resistance of the LDMOS begins to increase. This suggests that the performance of the LDMOS is improved by increasing the distance of the end of the well region HPW from the end of the gate electrode G1 on the source side of the LDMOS so as to make it away from the gate electrode G1.

However, if the distance between the end of the gate electrode G1 on the source side of the LDMOS and the end of the well region HPW is too large, the problem that the off-breakdown voltage may decrease arises. As mentioned above, the well region HPW is intended to improve the breakdown voltage of the LDMOS. Specifically, an increase in the distance between the end of the gate electrode G1 on the source side of the LDMOS and the end of the well region HPW implies that the length of the well region HPW is decreased and the breakdown voltage of the LDMOS may drop. If the length of the well region HPW is not changed, the off-breakdown voltage would not drop but the distance between LDMOSs would be increased, thereby making it difficult to reduce the size of the semiconductor device.

FIG. 15 shows the relation between length La and the off-breakdown voltage of the LDMOS.

In FIG. 15, the horizontal axis is the same as the horizontal axis of FIG. 14.

The vertical axis of FIG. 15 shows an increase or decrease in the off-breakdown voltage of the LDMOS, relative to the reference value 1.00. In short, a value on the vertical axis of FIG. 15 is a relative value.

As shown in FIG. 15, when length La is in the range from −0.2 μm to 0.2 μm, virtually no change is seen in the off-breakdown voltage of the LDMOS. On the other hand, when length La is −0.3 μm or so, the length of the well region HPW is smaller and the off-breakdown voltage of the LDMOS may drop.

Therefore, considering this test result in combination with the test result shown in FIG. 14, it is preferable that length La should be in the range from −0.2 μm to −0.1 μm. More specifically, in the gate length direction of the LDMOS, preferably the distance between the end of the gate electrode G1 on the source side of the LDMOS and the end of the well region HPW should be 0.1 μm or more and 0.2 μm or less. In the present embodiment, since the well region HPW is formed so that length La is within the above range, the performance of the semiconductor device can be improved and the reliability of the semiconductor device can be ensured.

In the present embodiment, the well region HPW is formed at the step in FIG. 3 and the gate electrode G1 is formed at the step in FIG. 8. Consequently, the end of the well region HPW can be at an adequate distance from the end of gate electrode G1 on the source side of the LDMOS.

For example, it is possible to use the same resist pattern RP3 to form the gate electrode G1 at the step in FIG. 8 and form the well region HPW by vertical ion implantation and form the channel region CH by oblique ion implantation at the step in FIG. 9. In that case, the end of the well region HPW is formed in a manner to be aligned with the end of the gate electrode G1. If so, the well region HPW would be diffused by later heat treatment to activate impurities, thereby causing the well region HPW to overlap the gate electrode G1 in plan view. This means that the on-resistance of the LDMOS would increase as explained above referring to FIG. 14. On the other hand, in the present embodiment, the well region HPW and the gate electrode G1 are formed using different resist patterns and thus the end of the well region HPW can be at an adequate distance from the end of the gate electrode G1 on the source side of the LDMOS so as to be away from the gate electrode G1. Therefore, the increase in the on-resistance of the LDMOS can be suppressed.

<Terminal Area TC of the LDMOS>

Next, the structure of the terminal area TC of the unit cell UC will be described referring to FIGS. 17, 18, and 19. As mentioned earlier, the line B-B in FIG. 17 is a line along which the sectional view FIG. 18 is taken in the gate length direction of the LDMOS in the terminal area TC. The line C-C in FIG. 17 is a line along which the sectional view FIG. 19 is taken in the gate width direction of the LDMOS in the active area AC and terminal area TC. The sectional views FIGS. 18 and 19 only show the area 1A in which the LDMOS is formed.

As shown in FIGS. 18 and 19, in the terminal area TC, the impurity region NS and diffusion layer S1 to configure the source region do not lie in the gate width direction. Therefore, the terminal area TC virtually does not contribute to operation of the transistor.

As shown in FIG. 12, in the active area AC, the end of the well region HPW is away from the end of the gate electrode G1 on the source side of the LDMOS in the gate length direction of the LDMOS and the length of the well region HPW is smaller than the length of the channel region CH.

However, as shown in FIGS. 17, 18, and 19, in the terminal area TC, the well region HPW overlaps the gate electrode G1 in plan view. Also, the length of the well region HPW is larger than the length of the channel region CH. Specifically, the channel region CH partially lies inside the well region HPW in the gate length direction and gate width direction of the LDMOS in plan view.

The terminal area TC is mainly intended to improve the breakdown voltage between the LDMOS and its vicinity. For this reason, the diffusion layer BG is surrounded by the channel region CH having a lower impurity concentration than the diffusion layer BG and the channel region CH is surrounded by the well region HPW having a lower impurity concentration than the channel region CH. This prevents the diffusion layer BG and channel region CH, both having a relatively high impurity concentration, from being in contact with the drift region NV directly so that the breakdown voltage of the LDMOS is improved.

As shown in FIG. 17, a corner of the channel region CH in plan view is a spot where an electric field is likely to concentrate. Therefore, the corner is surrounded by the well region HPW to reduce the curvature of the line of electric force in the corner and mitigate the electric field in the corner. In other words, in the gate length direction and gate width direction of the LDMOS, the formation of the channel region CH inside the well region HPW mitigates the electric field in the corner of the channel region CH in plan view and thereby improves the breakdown voltage of the LDMOS.

In addition, as shown in FIG. 17, in plan view, two LDMOSs are surrounded by the diffusion layer D1 to configure the drain region. As shown in FIGS. 18 and 19, the diffusion layer D1 is surrounded by the well region HNW. The well region HNW has a lower impurity concentration than the diffusion layer D1 and the drift region NV has a lower impurity concentration than the well region HNW. Therefore, even if a high voltage is applied to the drain region of the LDMOS, the concentration of the electric field and current on the diffusion layer D1 as part of the drain region is mitigated and thus the breakdown voltage of the LDMOS is improved. The well region HNW and the well region HPW are at a sufficient distance from each other so as not to be in contact with each other directly.

Since the terminal area TC is structured as mentioned above, the breakdown voltage of the LDMOS can be improved and the reliability of the semiconductor device can be improved.

Variation

Next, a semiconductor device and a method for manufacturing the same according to a variation of the first embodiment will be described referring to FIGS. 20 and 21. The sectional views FIGS. 20 and 21 only show the area 1A in which the LDMOS is formed.

In the first embodiment, the p-type well region HPW is formed by four ion implantation steps as described earlier in reference to FIG. 3. In the present variation too, the well region HPW is formed by four ion implantation steps as shown in FIG. 20 but at the first ion implantation step, ions are implanted obliquely. Consequently, the lower portion of the well region HPW is longer than the upper portion of the well region HPW in the gate length direction of the LDMOS as shown in FIG. 21.

Figure 20:
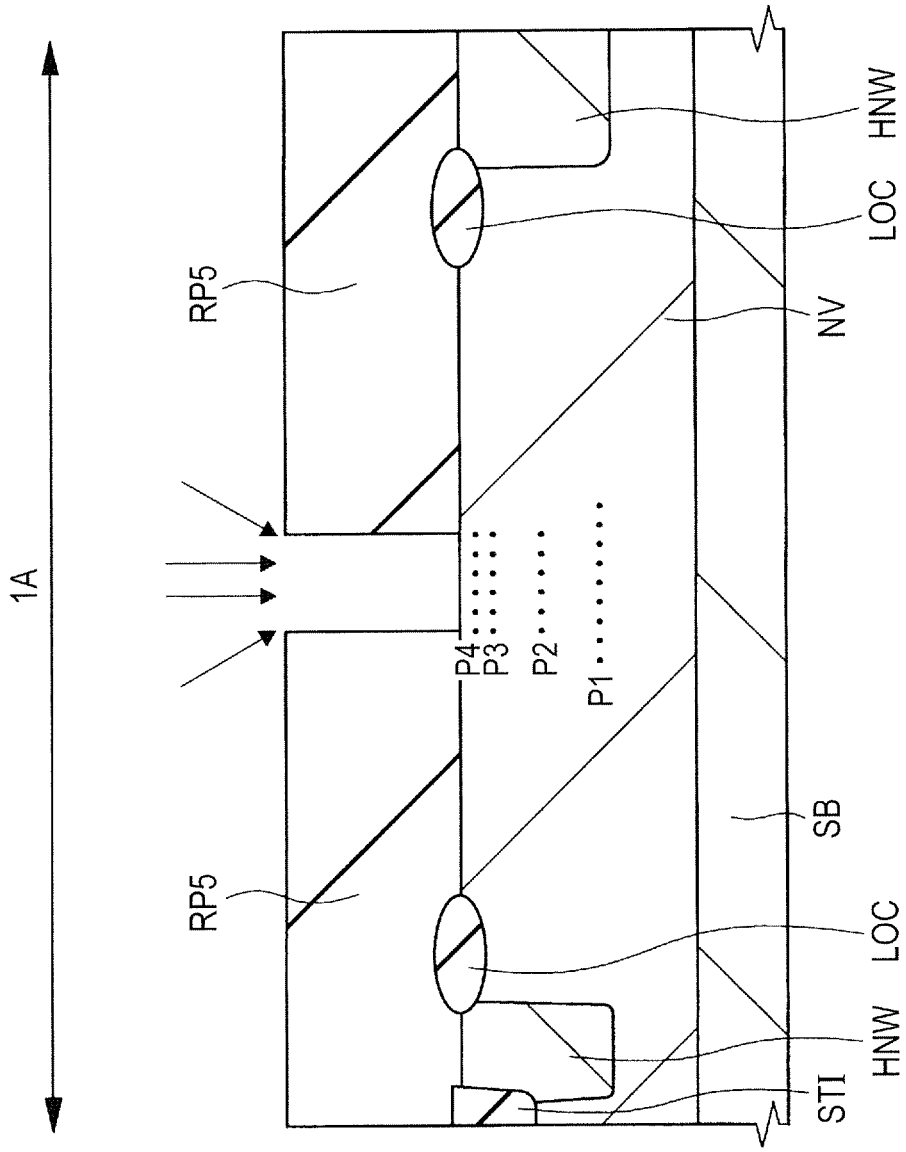
FIG. 20 is a sectional view which essentially shows a step in the process of manufacturing the semiconductor device according to a variation of the first embodiment.

FIG. 20 is a sectional view which corresponds to the step in FIG. 3 according to the first embodiment. In FIG. 20, a resist pattern RP5 is provided to expose the area for formation of the p-type well region HPW and the four ion implantation steps as mentioned above are carried out using the resist pattern RP5 as a mask. Specifically, each ion implantation step is performed under the following conditions. At the first ion implantation step, ions are implanted obliquely and at the second to fourth ion implantation steps, ions are implanted vertically.

The first ion implantation step is performed using, for example, boron (B) with an implantation energy of about 240 keV and a total dose of about $1.2 \times 10^{13}$/cm$^2$. The first ion implantation step is divided into four sub-steps, and at each sub-step, the semiconductor substrate SB is turned by 90 degrees.

The second ion implantation step is performed using, for example, boron (B) with an implantation energy of about 120 keV and a dose of about $2.5 \times 10^{12}$/cm$^2$.

The third ion implantation step is performed using, for example, boron (B) with an implantation energy of about 50 keV and a dose of about $1.5 \times 10^{12}$/cm$^2$.

The fourth ion implantation step is performed using, for example, boron difluoride (BF$_2$) with an implantation energy of about 60 keV and a dose of about $2.2 \times 10^{12}$ to $1.2 \times 10^{13}$/cm$^2$.

In FIG. 20, peaks in the first to fourth ion implantation steps for the well region HPW are expressed as peaks P1 to P4 by dotted lines respectively. Since the first ion implantation step is performed by oblique ion implantation, in the gate length direction of the LDMOS, peak P1 is wider than the other peaks P2 to P4.

After that, the implanted ion impurities are activated by heat treatment of the semiconductor substrate SB to form a p-type well region HPW. This heat treatment is performed, for example, at about 950° C. for 60 seconds. As a consequence, the lower portion of the well region HPW is longer than the upper portion of the well region HPW in the gate length direction of the LDMOS.

Figure 21:
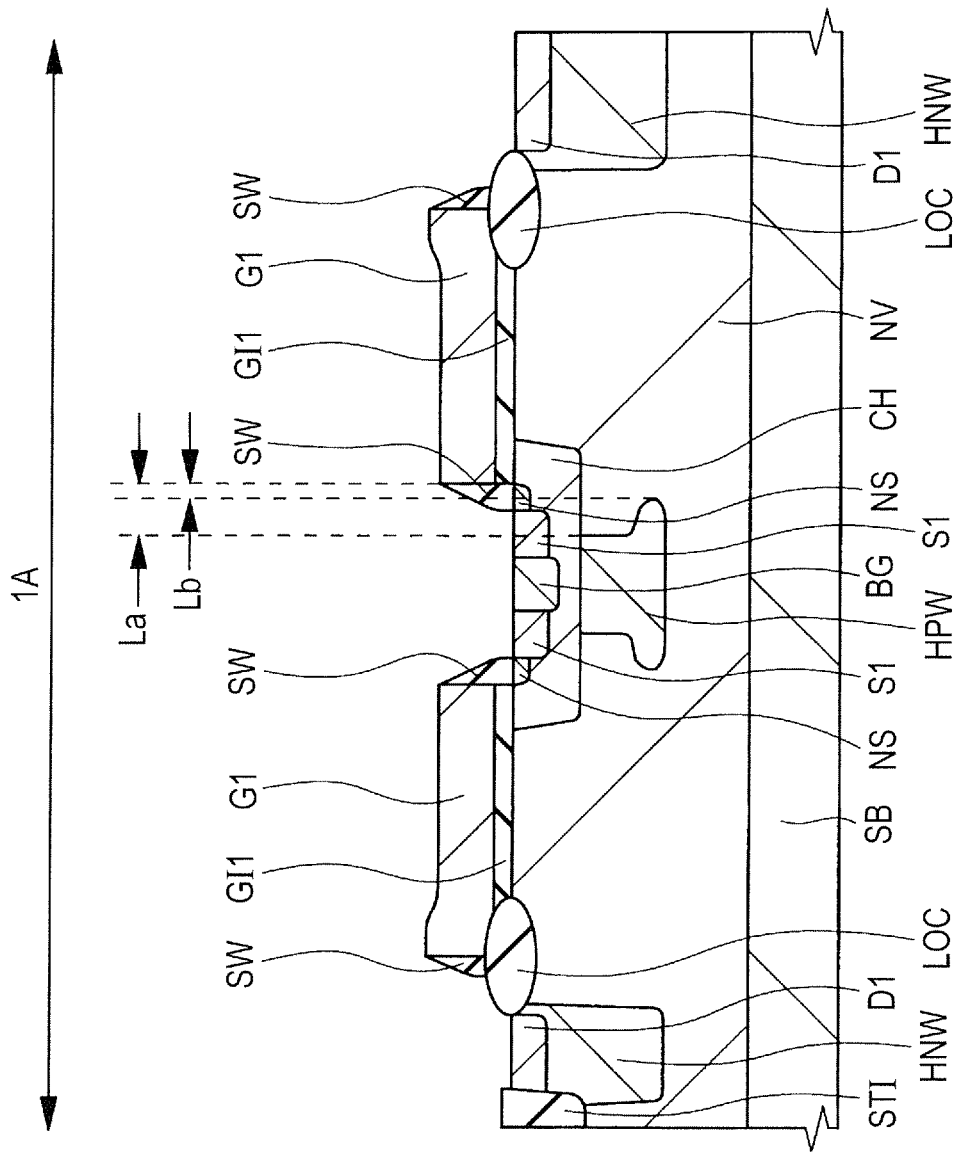
FIG. 21 is a sectional view which essentially shows a step following the step shown in FIG. 20 in the process of manufacturing the semiconductor device.

After that, the same subsequent steps as described above in reference to FIGS. 4 to 12 are taken to obtain the structure shown in FIG. 21.

FIG. 21 is a sectional view which corresponds to FIG. 12 according to the first embodiment. FIG. 21 shows length La and length Lb. Length La is the same as described in reference to FIGS. 14 and 15 and represents the distance from the end of the gate electrode G1 on the source side of the LDMOS to the end of the upper portion of the well region HPW in the gate length direction of the LDMOS. Length La represents the distance from the end of the gate electrode G1 on the source side of the LDMOS to the end of the lower portion of the well region HPW in the gate length direction of the LDMOS.

The present variation is different from the first embodiment in that the lower portion of the well region HPW is longer than the upper portion of the well region HPW in the gate length direction of the LDMOS. Therefore, the end of the well region HPW portion formed in the channel region CH is away from the end of the gate electrode G1 on the source side of the LDMOS (length La). On the other hand, the end of the well region HPW portion located in a deeper position than the channel region CH and in contact with the drift region NV is nearer to the end of the gate electrode G1 than the well region HPW portion formed in the channel region CH (length Lb). The lower portion of the well region HPW may overlap the gate electrode G1 in plan view. Specifically, length Lb may extend to under the gate electrode G1. In other words, in the gate length direction of the LDMOS, the lower portion of the well region HPW is nearer to the drain side end of the gate electrode G1 than the upper portion of the well region HPW.

As illustrated in FIG. 14, the on-resistance of the LDMOS is largely affected in the vicinity of the surface of the semiconductor substrate SUB, namely an area in which the channel region CH is formed. According to the study by the present inventors, an increase in the on-resistance of the LDMOS has not been found even when the length of the lower portion of the well region HPW formed at a distance from the channel region CH is increased. Also, a significant influence on the off-breakdown voltage of the LDMOS has not been seen. Therefore, the semiconductor device in the present variation also brings about the same advantageous effects as in the first embodiment.

The invention made by the present inventors has been so far explained concretely in reference to the preferred embodiments thereof. However, the invention is not limited to the above embodiments and it is obvious that these details may be modified in various ways without departing from the gist thereof.

What is claimed is:

1. A semiconductor device comprising:
   a first gate insulating film of a first MISFET formed over a semiconductor substrate;
   a first gate electrode of the first MISFET, formed over the first gate insulating film;
   a first drain region of a first conductivity type, formed in the semiconductor substrate on one end side of the first gate electrode in a gate length direction of the first MISFET;
   a first well region which is formed in the semiconductor substrate on another end side of the first gate electrode in the gate length direction of the first MISFET and of a second conductivity type as a conductivity type opposite to the first conductivity type;
   a first channel region of the second conductivity type which is formed in the semiconductor substrate including the first well region and has a higher impurity concentration than the first well region; and
   a first source region of the first conductivity type, formed in the first channel,
   wherein depth of the first well region is larger than depth of the first channel region,
   wherein the first channel region partially overlaps the first gate electrode in plan view, and
   wherein in the gate length direction of the first MISFET, an end of the first well region in the first channel region is at a distance from another end of the first gate electrode in a manner to be away from the first gate electrode.

2. The semiconductor device according to claim 1, wherein distance of the end of the first well region in the first channel region from the other end of the first gate electrode is 0.1 µm or more and 0.2 µm or less.

3. The semiconductor device according to claim 1,
   wherein in a gate width direction of the first MISFET, the first MISFET includes an active area in which the first source region is formed in the first channel region and a terminal area in which the first source region is not formed in the first channel region,
   wherein the first well region in the terminal area overlaps the first gate electrode in plan view, and
   wherein a portion of the first channel region is formed inside the first well region in the gate length direction and the gate width direction of the first MISFET in plan view.

4. The semiconductor device according to claim 3,
   wherein the first drain region includes a second well region of the first conductivity type and a first diffusion layer which is formed in the second well region, has a higher impurity concentration than the second well region and is of the first conductivity type, and
   wherein the first well region in the terminal area is at a distance from the second well region in a manner not to be in contact with the second well region directly.

5. The semiconductor device according to claim 1,
   wherein the first well region includes an upper portion formed in the first channel region and a lower portion formed in a position deeper than the first channel region, and
   wherein in the gate length direction of the first MISFET, the lower portion of the first well region is nearer to the one end side of the first gate electrode than the upper portion of the first well region.

6. The semiconductor device according to claim 5,
   wherein the upper portion of the first well region does not overlap the first gate electrode in plan view, and
   wherein the lower portion of the first well region overlaps the first gate electrode in plan view.

7. The semiconductor device according to claim 1,
   wherein a first insulating film with a larger thickness than the first gate insulating film is formed over the semiconductor substrate, and
   wherein the one end of the first gate electrode lies over the first insulating film.

8. The semiconductor device according to claim 1,
   wherein the first conductivity type is n type, and
   wherein the second conductivity type is p type.

9. A semiconductor device manufacturing method, comprising the steps of:
   (a) forming, in a semiconductor substrate of a first conductivity type, a first well region of a second conductivity type as a conductivity type opposite to the first conductivity type;
   (b) forming a first gate insulating film of a first MISFET over the semiconductor substrate;
   (c) forming a first conductivity film over the first gate insulating film;
   (d) forming a second conductivity film by selectively removing the first conductivity film so as to expose a first drain region side of the first MISFET;
   (e) forming a first resist pattern over the second conductivity film;
   (f) after the step (e), forming a first gate electrode of the first MISFET by selectively removing the second conductivity film using the first resist pattern as a mask so as to expose a first source region side of the first MISFET; and
   (g) after the step (f), forming a first channel region of the second conductivity type having a higher impurity concentration than the first well region in the semiconductor substrate with the first well region formed therein, by implanting ions in the presence of the first resist pattern,
   wherein depth of the first well region is larger than depth of the first channel region,
   wherein the first channel region partially overlaps the first gate electrode in plan view, and wherein in a gate length direction of the first MISFET, an end of the first well region inside the first channel region is at a distance from an end of the first gate electrode on the first source region side in a manner to be away from the first gate electrode.

10. The semiconductor device manufacturing method according to claim 9, further comprising the steps of:
(h) after the step (g), removing the first resist pattern;
(i) after the step (h), forming a second resist pattern over the first gate electrode to expose the first channel region;
(j) forming, in the first channel region, an impurity region of the second conductivity type to become part of the first source region, by implanting ions in the presence of the second resist pattern; and
(k) after the step (j), removing the second resist pattern,
wherein ion implantation at the step (g) is performed at a first tilting angle with respect to a vertical line to the semiconductor substrate, and
wherein ion implantation at the step (j) is performed at an angle vertical to the semiconductor substrate or at a second tilting angle with respect to the vertical line to the semiconductor substrate which is smaller than the first angle.

11. The semiconductor device manufacturing method according to claim 10, wherein thickness of the first resist pattern formed at the step (e) is larger than thickness of the second resist pattern formed at the step (i).

12. The semiconductor device manufacturing method according to claim 9, wherein thickness of the first resist pattern formed at the step (e) is at least four times larger than thickness of the second conductivity film.

13. The semiconductor device manufacturing method according to claim 12, wherein the thickness of the first resist pattern at the step (g) is at least twice larger than thickness of the first gate electrode.

14. The semiconductor device manufacturing method according to claim 9, the step (a) as a step of forming the first well region, comprising the steps of:
(a1) forming a lower portion of the first well region in the semiconductor substrate in a position deeper than the first channel region, by first ion implantation; and
(a2) forming an upper portion of the first well region in the first channel region by second ion implantation,
wherein the second ion implantation is performed at a first tilting angle with respect to a vertical line to the semiconductor substrate, and
wherein the first ion implantation is performed at an angle vertical to the semiconductor substrate or at a second tilting angle with respect to the vertical line to the semiconductor substrate which is smaller than the first angle.

15. The semiconductor device manufacturing method according to claim 14, wherein in the gate length direction of the first MISFET, the lower portion of the first well region is nearer to an end of the first gate electrode on the first drain region side than the upper portion of the first well region.

16. The semiconductor device manufacturing method according to claim 15,
wherein the upper portion of the first well region does not overlap the first gate electrode in plan view, and
wherein the lower portion of the first well region overlaps the first gate electrode in plan view.

17. The semiconductor device manufacturing method according to claim 9,
wherein the first MISFET is formed in a first region of the semiconductor substrate,
wherein a second MISFET is formed in a second region of the semiconductor substrate which is different from the first region,
wherein at the step (a), a second well region of the second conductivity type is formed in the second region of the semiconductor substrate,
wherein at the step (c), the first conductivity film is also formed over the second well region, and
wherein at the step (d), a second gate electrode of the second MISFET is formed by selectively removing the first conductivity film in the second region so as to expose a second drain region side and a second source region side of the second MISFET.

18. The semiconductor device manufacturing method according to claim 9,
wherein the first conductivity type is n type, and
wherein the second conductivity type is p type.

19. The semiconductor device manufacturing method according to claim 9,
wherein the first MISFET has an active area in which the first source region is formed in the first channel region in a gate width direction of the first MISFET, and a terminal area in which the first source region is not formed in the first channel region in the gate width direction of the first MISFET,
wherein the first well region in the terminal area overlaps the first gate electrode in plan view, and
wherein a portion of the first channel region is formed inside the first well region in the gate length direction and the gate width direction of the first MISFET in plan view.

* * * * *